(12) United States Patent
Seliskar

(10) Patent No.: US 8,664,071 B2
(45) Date of Patent: *Mar. 4, 2014

(54) CASTELLATED GATE MOSFET TETRODE CAPABLE OF FULLY-DEPLETED OPERATION

(76) Inventor: John James Seliskar, Midlothian, VA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/385,990

(22) Filed: Mar. 19, 2012

(65) Prior Publication Data

US 2012/0228710 A1 Sep. 13, 2012

Related U.S. Application Data

(60) Division of application No. 12/660,233, filed on Feb. 23, 2010, now Pat. No. 8,138,544, which is a continuation-in-part of application No. 10/940,093, filed on Sep. 13, 2004, now Pat. No. 7,211,864.

(51) Int. Cl.
- H01L 21/336 (2006.01)
- H01L 21/3205 (2006.01)
- H01L 21/4763 (2006.01)
- H01L 21/00 (2006.01)
- H01L 21/84 (2006.01)

(52) U.S. Cl.
USPC .......... 438/301; 438/271; 438/587; 438/296; 438/151

(58) Field of Classification Search
USPC ......... 438/151, 301, 152–166, 268, 404, 305, 438/306, 270, 271, 587, 588, 176, 177, 195
See application file for complete search history.

(56) References Cited

U.S. PATENT DOCUMENTS

2007/0218635 A1* 9/2007 Seliskar .................. 438/268

* cited by examiner

*Primary Examiner* — Chuong A. Luu

(57) ABSTRACT

A method of fabricating a castellated-gate MOSFET tetrode device capable of fully depleted operation is disclosed. The device is formed on a semiconductor substrate region having an upper portion with a top surface and a lower portion with a bottom surface. A source region and a drain region are formed by ion implantation into the semiconductor substrate region, with adjoined primary and secondary channel-forming regions also disposed therein between the source and drain regions, thereby forming an integrated cascode structure. A plurality of thin semiconductor channel elements are formed by etching a plurality of spaced gate slots to a first predetermined depth into the substrate. The formation of first, second, and additional gate structures are described in two possible embodiments which facilitate the formation of self-aligned source and drain regions.

3 Claims, 24 Drawing Sheets

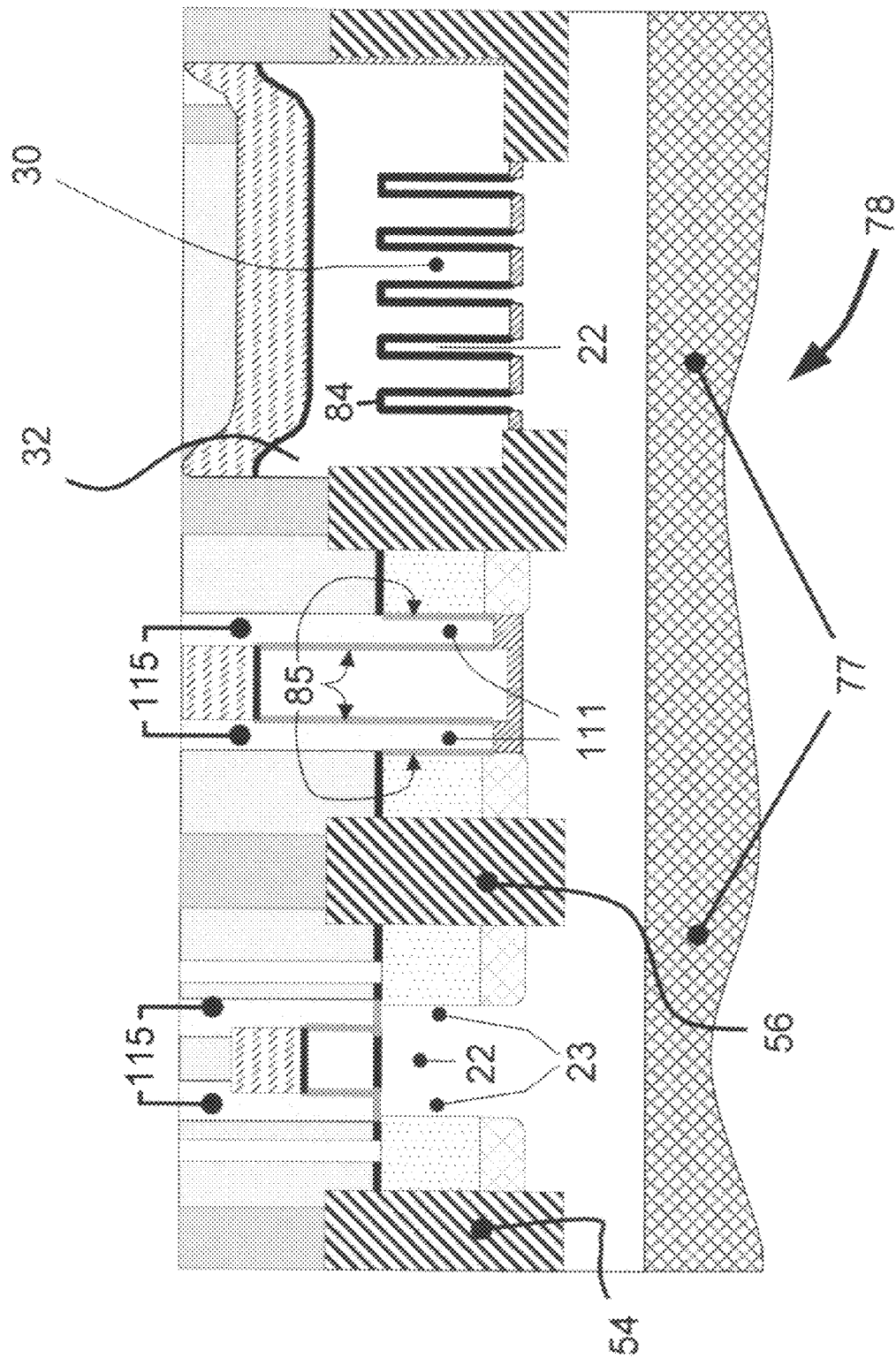

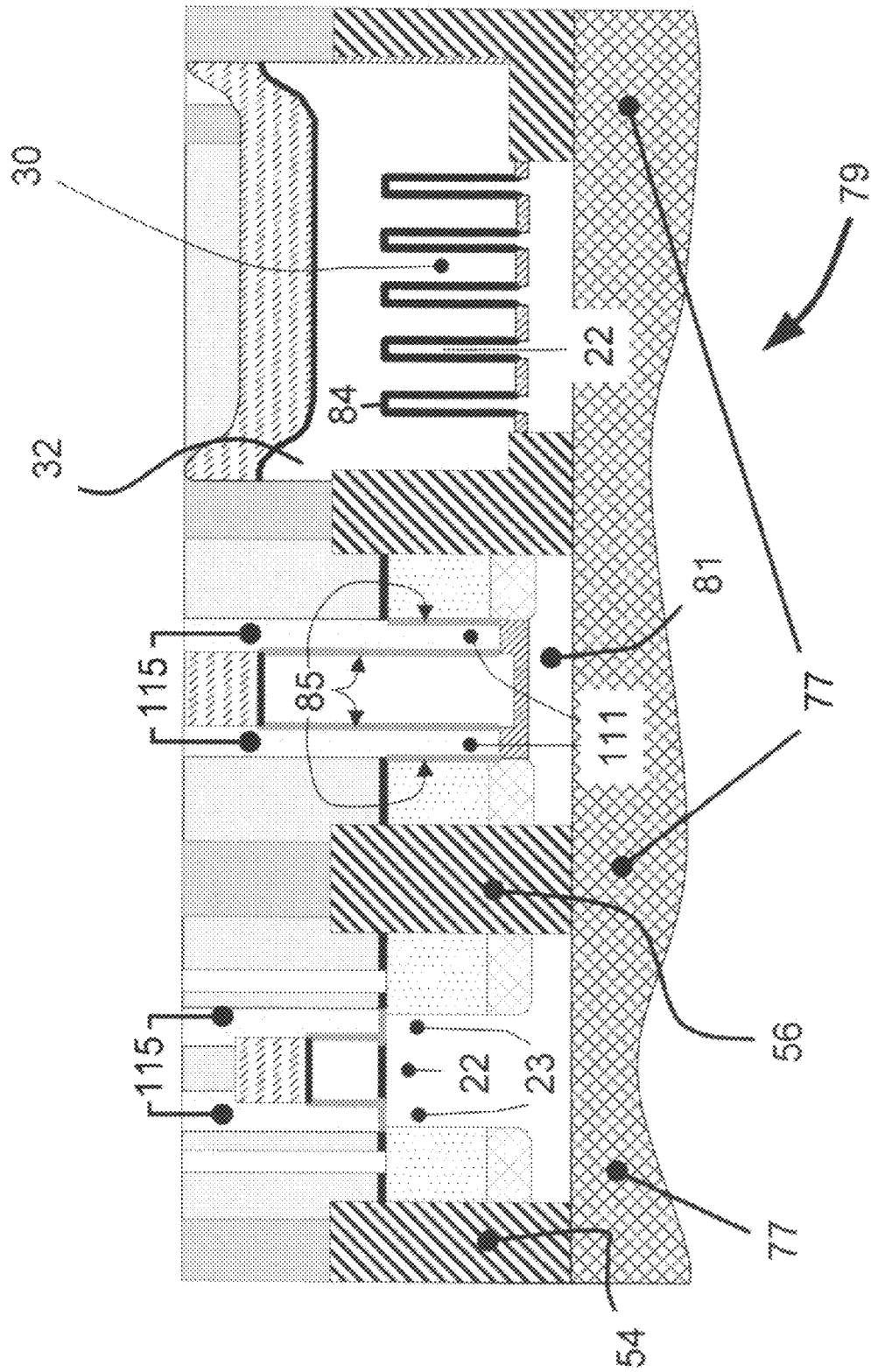

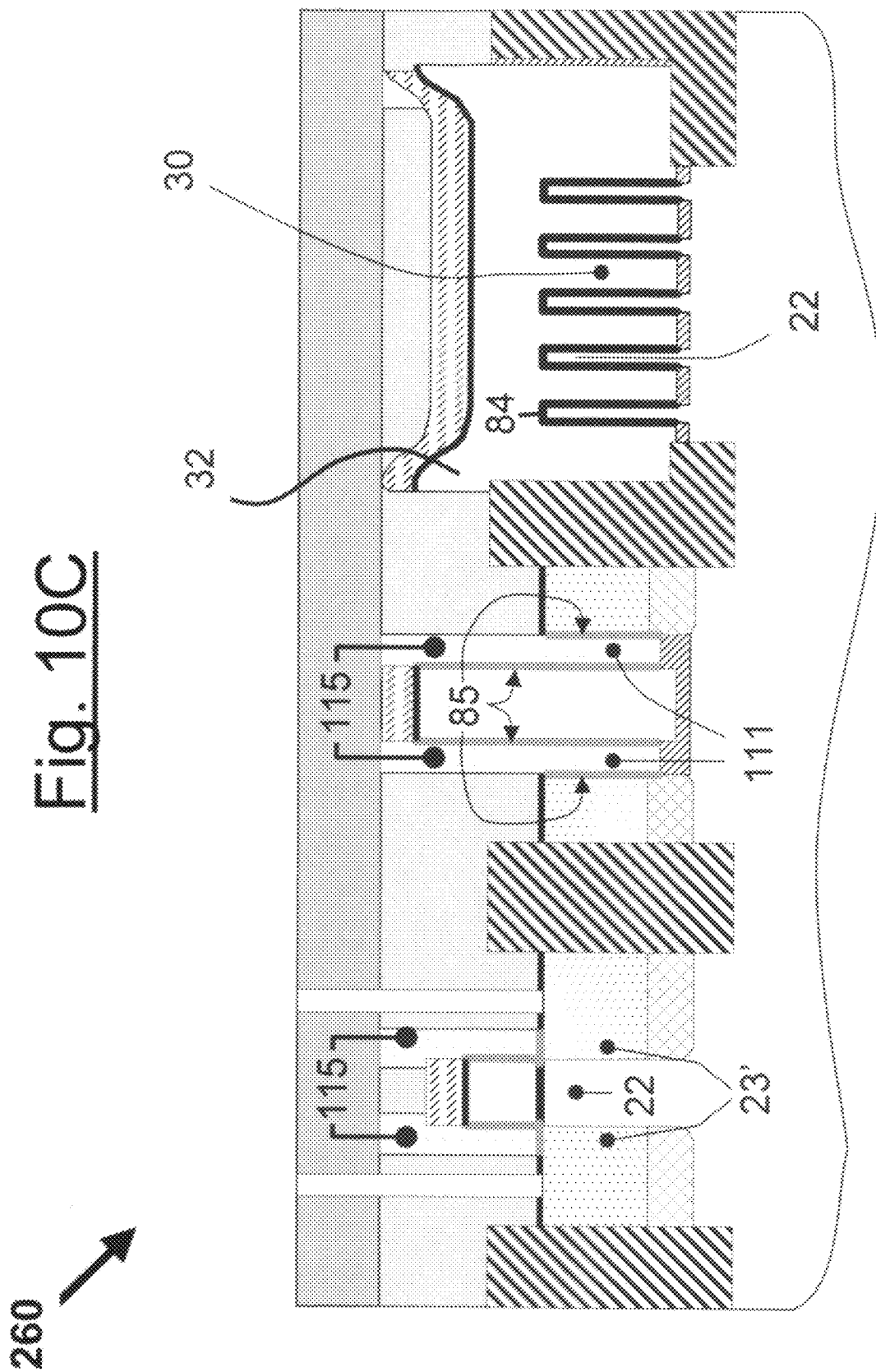

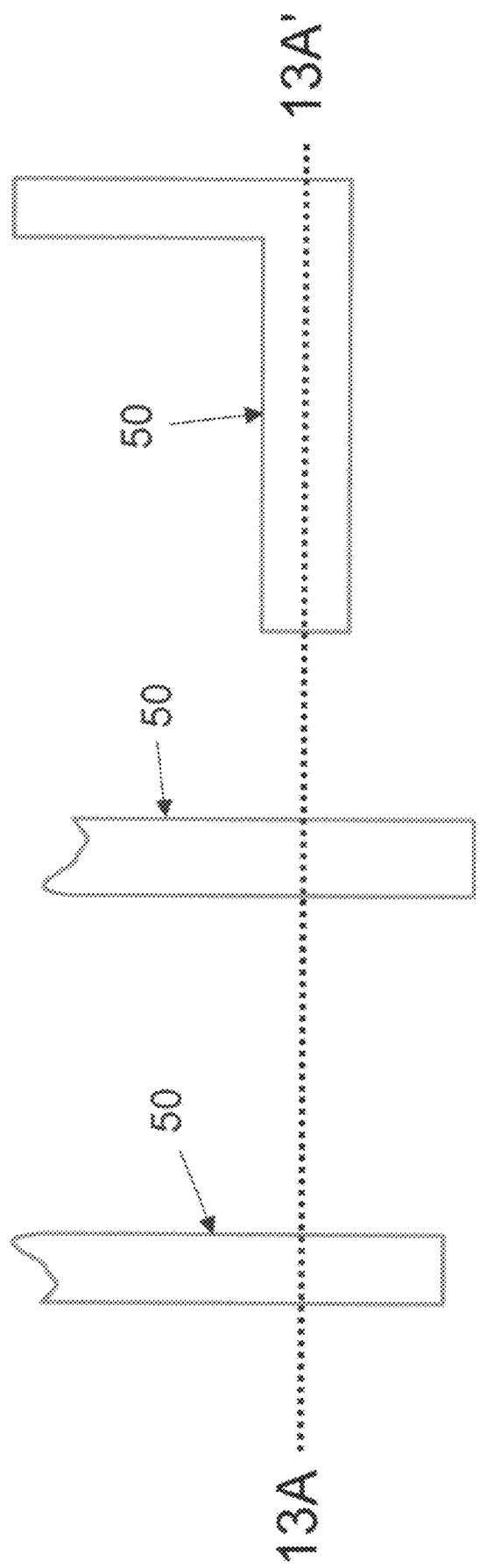

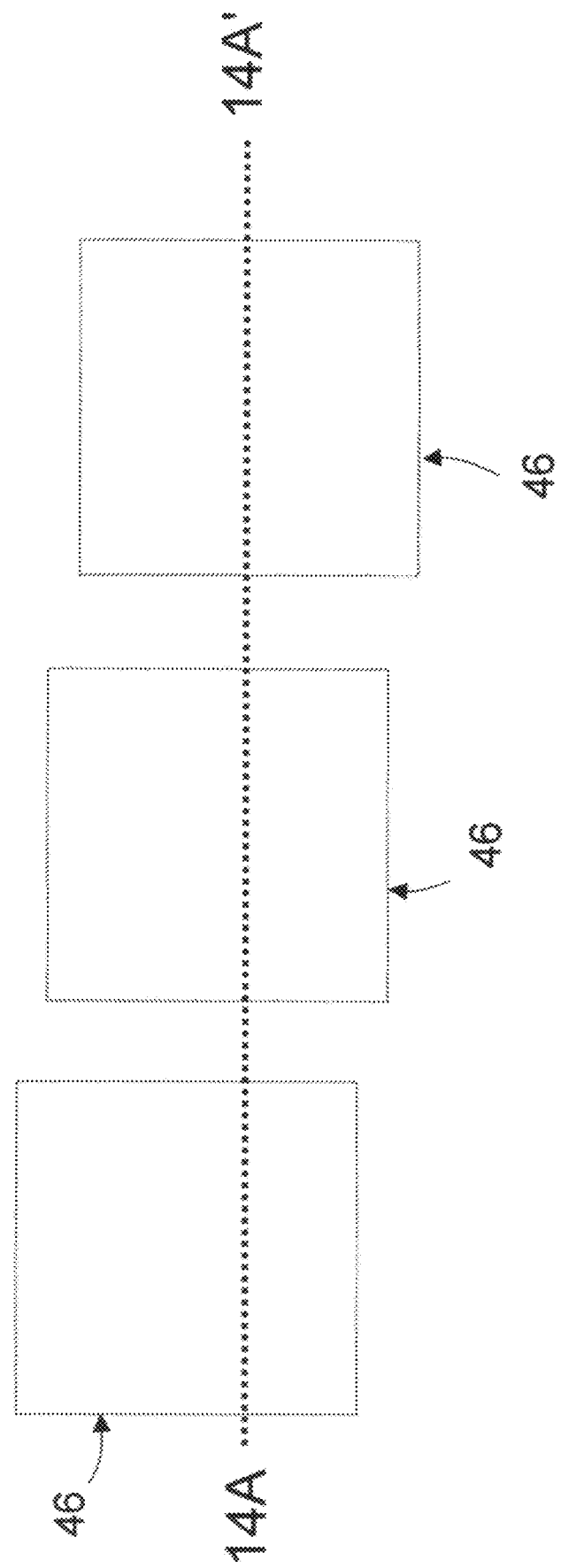

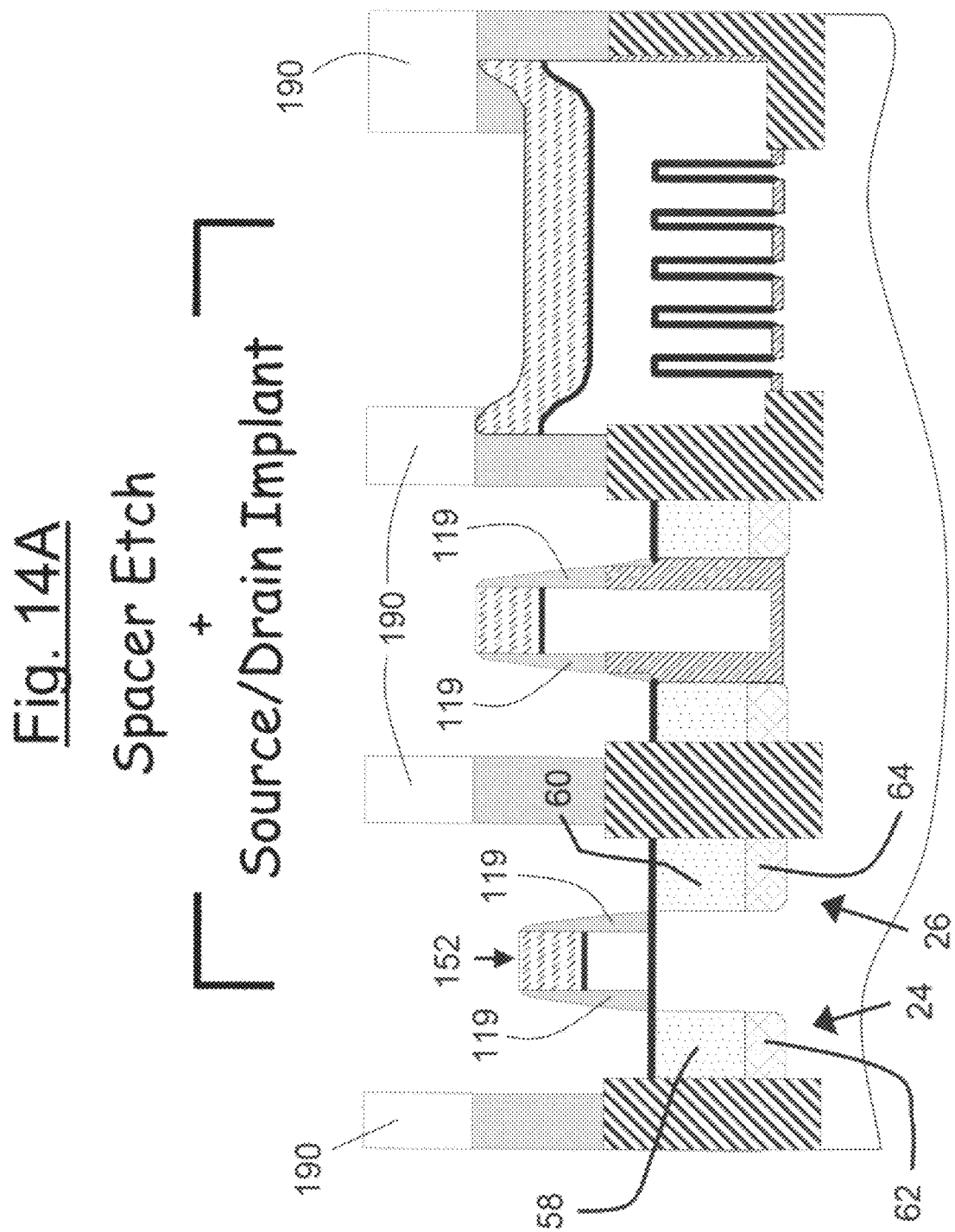

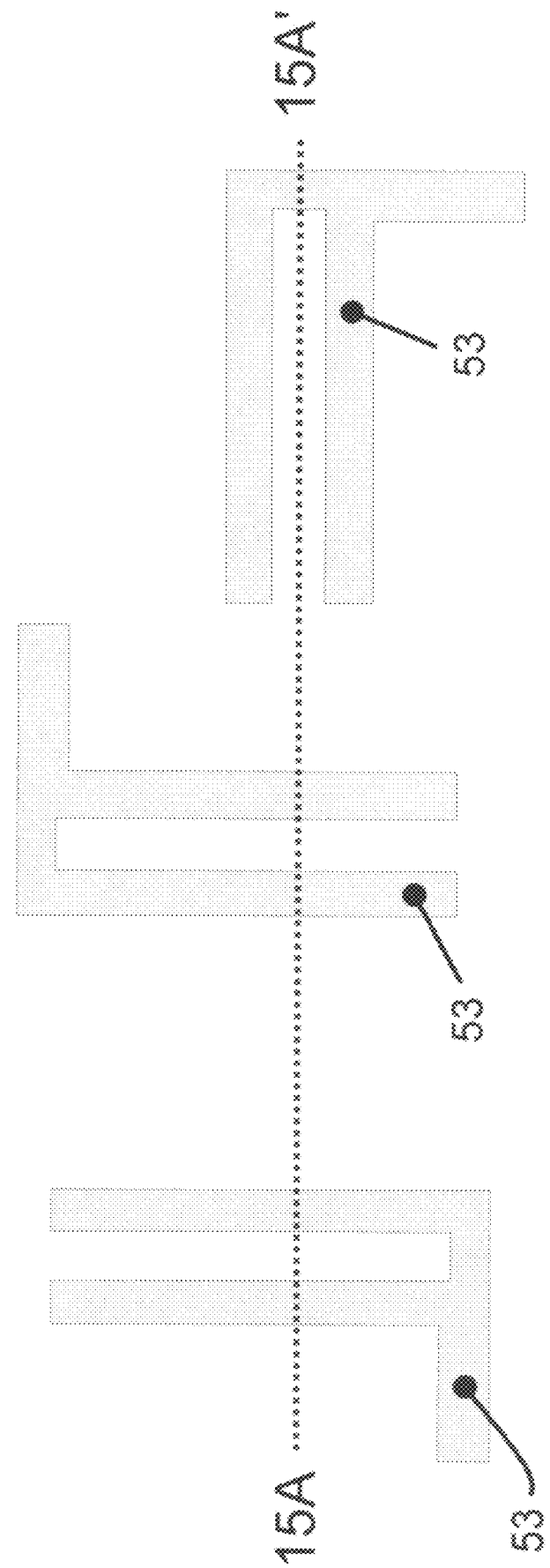

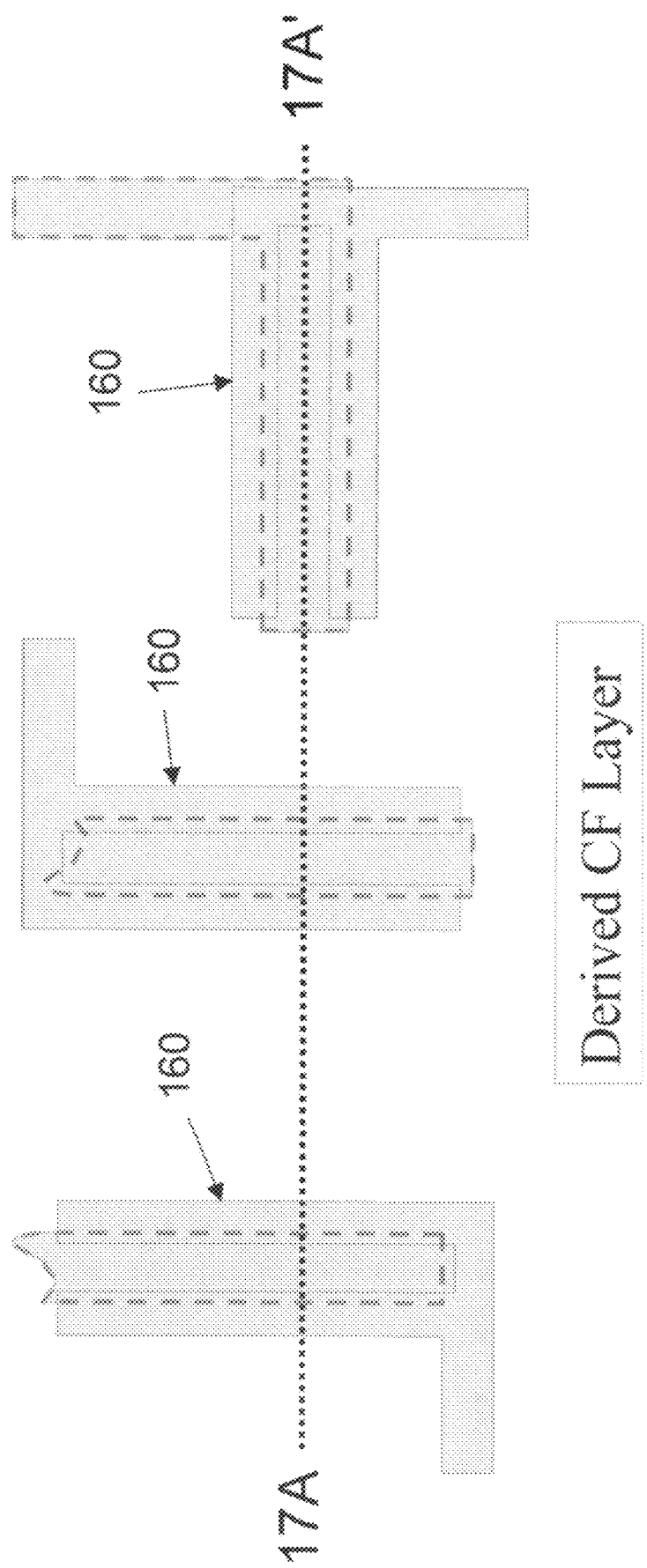

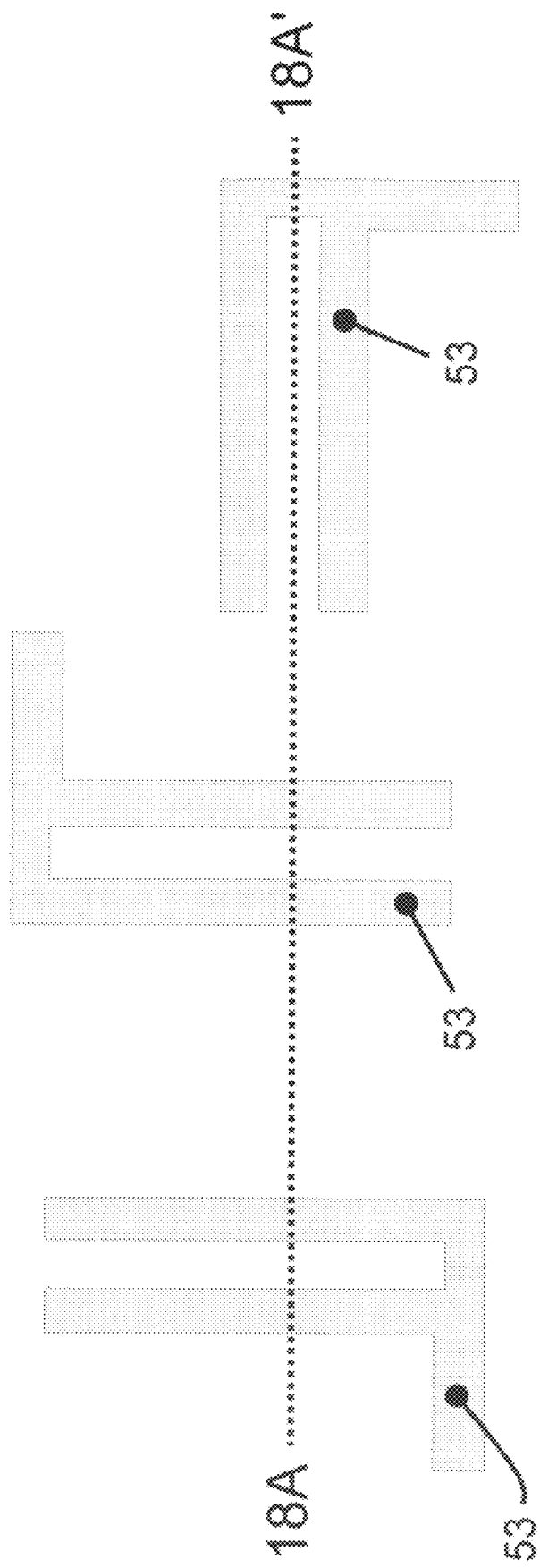

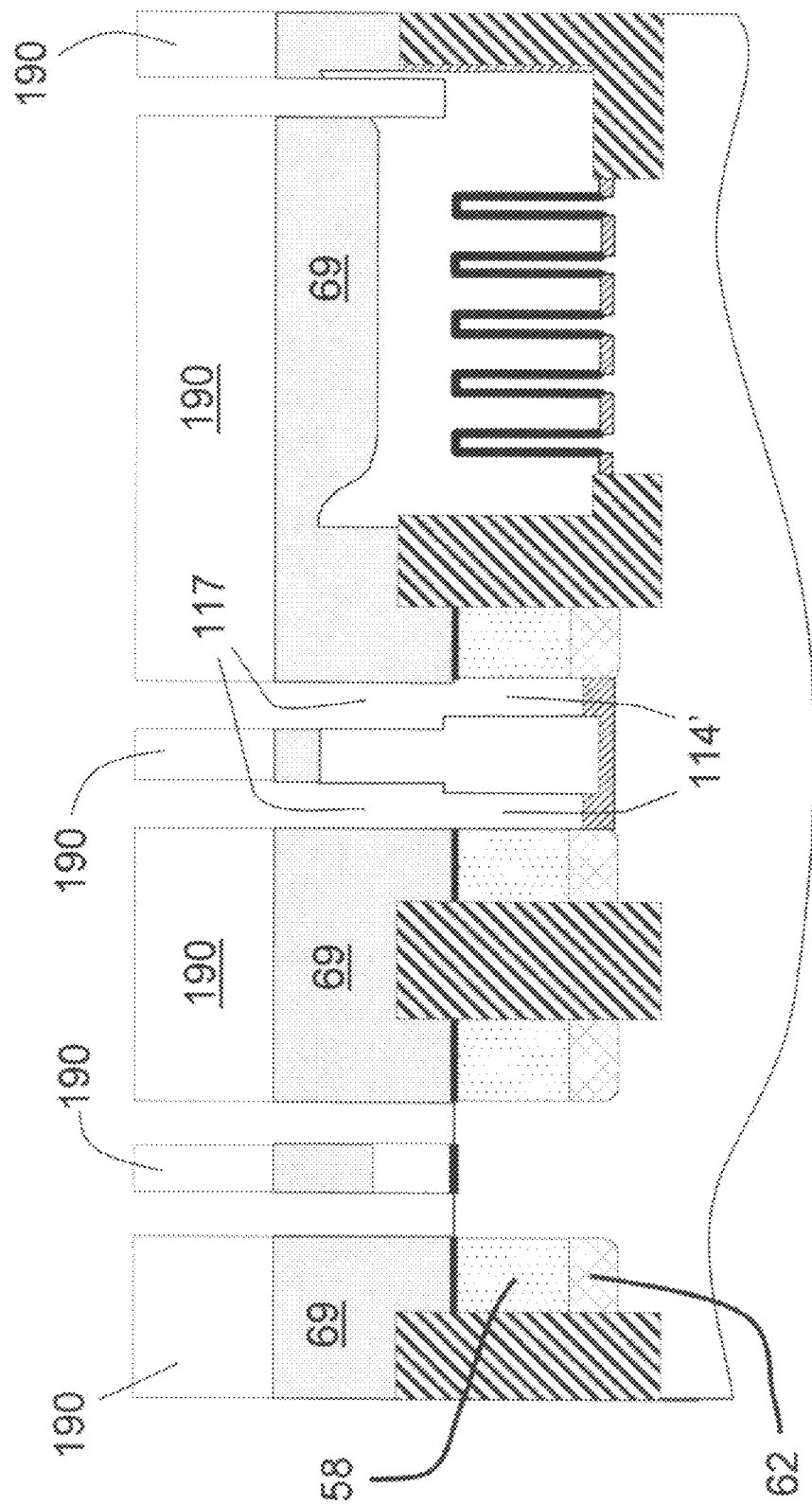

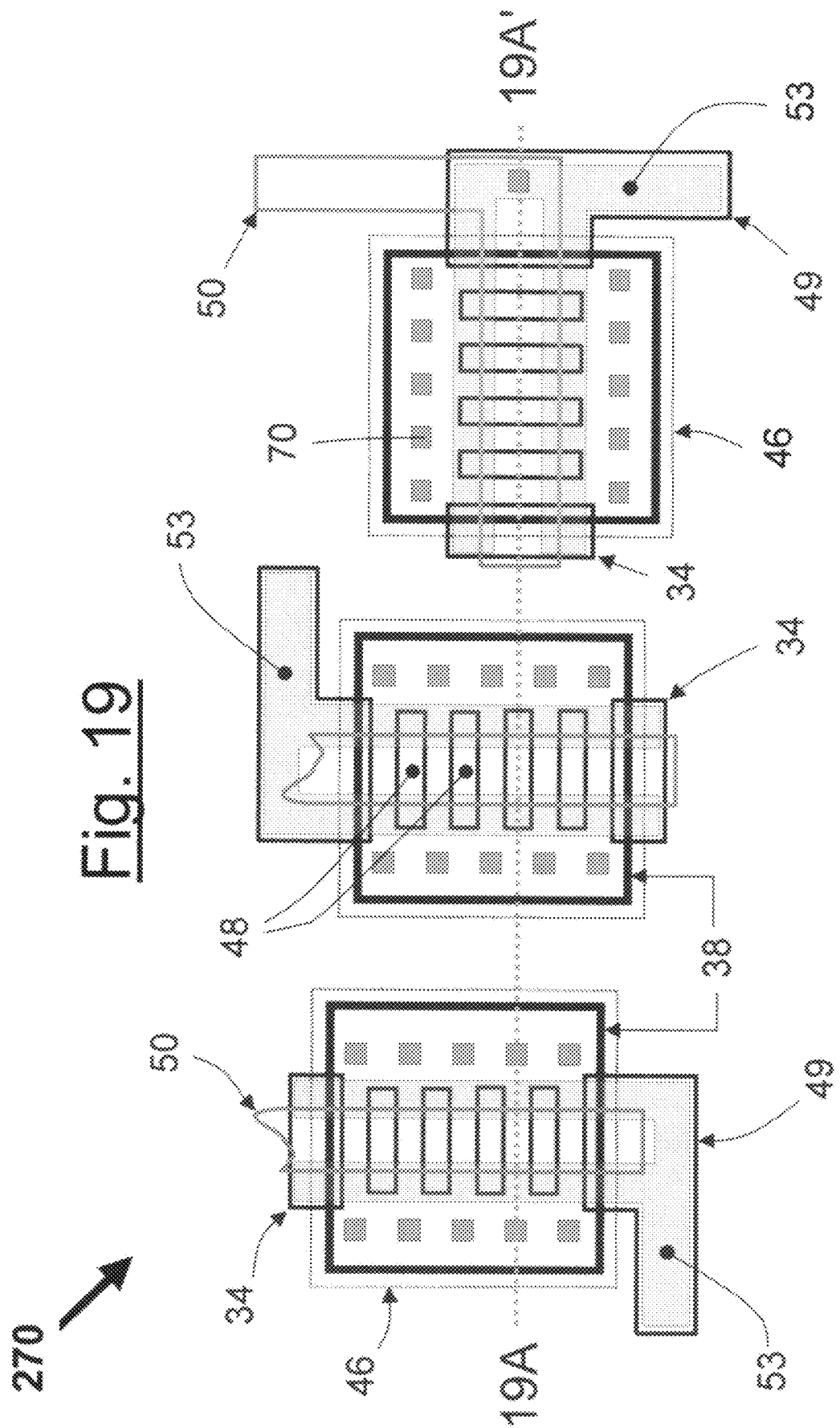

CASTELLATED GATE MOSFET TETRODE CAPABLE OF FULLY-DEPLETED OPERATION

CROSS REFERENCE TO RELATED APPLICATIONS

This application is a division of co-pending U.S. patent application Ser. No. 12/660,233, filed Feb. 23, 2010, by John J. Seliskar, entitled "Castellated Gate MOSFET Tetrode Capable of Fully-Depleted Operation", the contents of which are hereby expressly incorporated herein by reference. Application Ser. No. 12/660,233 is a continuation-in-part of parent application Ser. No. 10/940,093 entitled "An Improved Fully-Depleted Castellated Gate MOSFET Device and Method of Manufacture Thereof", now U.S. Pat. Nos. 7,212,864 and 7,439,139

BACKGROUND OF THE INVENTION

1. Field of the Invention

The present invention relates generally to field effect transistors (FET's) formed as complimentary metal oxide semiconductor (CMOS) structures and, more particularly, to new and improved MOSFET devices having vertically oriented channel structures capable of fully depleted operation. Specifically, the present invention relates to an improved vertically oriented MOSFET device and method of fabrication thereof which incorporates a tetrode gate structure, thereby providing an integrated cascode for high performance analog and mixed-signal applications.

2. Description of the Prior Art

The progression of CMOS device scaling, that is planer MOSFET, has seen a continuous shrinking of transistor dimensions in both the vertical and the horizontal dimensions resulting in an approximate doubling of the number of transistors per unit area every 18 months or so. From the economics perspective, this scaling progression has resulted in CMOS becoming the preeminent technology for packing system functions on a transistor chip. The desire to shrink gate channel lengths and hence area, as width-to-length ratios remain roughly constant, requires the simultaneous vertical scaling of both the gate oxide and the source/drain junctions. This creates the requirement that the power supply (Vdd) also scale, as indicated above. The power supply voltage must scale so as to maintain gate oxide integrity (breakdown/wear-out due to voltage stress), to provide adequate junction breakdown margin, and to minimize device lifetime reduction due to hot carrier injection.

While CMOS scaling has enabled the circuit and system designer to pack a tremendous amount of functionality onto a silicon die, it has simultaneously created a number of significant problems as far as the chip's ability to interface with the outside world. This is particularly true in the area of analog/digital mixed-signal chips, and in particular for communication and power management applications which may be used or exist in a less-controlled signaling environment than found in all-digital systems. Some examples of the efforts to overcome this are illustrated in U.S. Pat. Nos. 4,393,391, 4,583, 107, 5,675,164, 5,801,417, 5,932,911, 6,111,296, 6,118,161, 6,207,511, 6,396,108, and 6,413,802.

The continuing drive to utilize semiconductor chip area while maintaining I/O compatibility has resulted in the evolution of baseline CMOS ASIC/SOC process technologies that now have two gate oxides to account for the need to operate efficiently at two, and sometimes three, power supply levels. Having begun at roughly the 0.25 um node, this is currently the approach taken by certain mainstream ASIC/ASSP semiconductor producers or foundries. These technology offerings generally consist of a baseline process flow that has a fully scaled and optimized thin oxide core device to the extent that the current process manufacturing technology allows, and a thick oxide device which is essentially the core device from the previous technology generation. Unfortunately, in such technology evolution, the thick oxide I/O device has become somewhat of a "forgotten stepchild", as only the thin-oxide core devices can truly take advantage of the shrinking feature sizes that are enabled by state-of-the-art photolithography. More importantly, as the thick oxide device is a "leftover" from the previous technology node, it typically under-performs the thin-oxide core device in terms of speed/bandwidth ($f_t$).

The impact of this trend is particularly acute in the area of all-CMOS analog and mixed analog/digital signal chips. These chips derive their advantage from the ability to integrate complex digital core functions, such as DSP, with analog signal processing functions, such as analog-to-digital or digital-to-analog converters. While this reliability-driven voltage trend results in lower power consumption for digital functions, the effect is not necessarily the same in the analog case. In fact, it has been shown that in an analog-to-digital converter application with a fixed dynamic range requirement, power consumption can actually increase with decreasing power supply.

At present, BiCMOS (bipolar-CMOS combination) technologies, and particularly SiGe bipolar, offer a solution to some of the problems discussed above. However, a number of difficulties persist including, in particular, power consumption, cost and scalability. Bipolar devices consume significantly more power than CMOS devices, which increases package cost and at some point renders them unsuitable as a system solution, in particular for portable devices. From the standpoint of scaling, bipolar technologies have hit an apparent limit in terms of increasing performance for a given density and power consumption. The integration of CMOS and bipolar devices (BiCMOS) reduces the power consumption problem but leads to a second difficulty, i.e. cost. High performance technologies, such as SiGe BiCMOS cost upwards of 25% or more than CMOS devices at the same feature sizes. Finally, bipolar devices by nature, like the thick oxide CMOS I/O devices discussed earlier, cannot take full advantage of decreasing feature sizes which result from advances in wafer patterning technology (photolithography).

Clearly, the trends and problems discussed above may soon create a situation where it is no longer desirable to integrate a significant amount of analog functionality into a single-chip mixed-signal system solution, thus eliminating one of the traditional paths to reduce cost and power consumption in electronic systems. Recently new device structures have been proposed to provide solutions which overcome the aforementioned problems, as is detailed in U.S. Pat. No. 7,212,864, mentioned in the cross-reference subsection of this application. As shown in FIG. 1, the prior art castellated gate MOSFET triode device 3 (or alternately, FDCG MOSFET) is a non-planar structure having lateral current flow through a plurality of semiconductor channels. While the prior art device of U.S. Pat. No. 7,212,864 provides a number of solutions to the analog and mixed-signal problem in all-CMOS technologies, some problems still exist in the quest to provide still higher performance and robustness.

One of the more persistent problems in the area of three terminal electron devices, and field effect transistors in particular, is the well known trade-off between device series resistance ($R_{dsw}$) and parasitic gate-to-drain, or source capacitance. Elements of this problem were encountered early on during the era of the vacuum tube triode, leading to the development of the vacuum tube tetrode (British Patent No. 145,421, 1921), wherein an auxiliary screen grid was added which substantially reduced the miller capacitance between the primary control grid and the anode. In summary, the addition of an additional control electrode resulted in the creation of a compound device that had the functional features of a cascode circuit arrangement of two triode devices.

Moving forward to the semiconductor era, multiple gate arrangements 5 were proposed for Field Effect devices, as shown in FIG. 2, to solve a similar set of problems (U.S. Pat. No. 3,803,461). These prior art FET devices were later utilized in a number of novel RF circuit topologies 7, as shown in FIG. 3 (U.S. Pat. No. 4,167,681). Recently, as shown in FIG. 4, a novel discrete power HEMT FET device 9, utilizing an integrated cascode structure 10, has been disclosed to improve the performance of solid-state RF power amplifiers (U.S. Pat. No. 7,126,426).

More specifically, in the case of vertically oriented field effect devices, the utilization of multiple gate electrodes have been proposed for a large number of purposes. For example, FIG. 5 illustrates a prior art vertical fin device 15 which utilizes multiple gates to control a common primary channel structure (U.S. Pat. No. 7,126,426). One application of such a gate arrangement is to facilitate the implementation of multiple-threshold logic circuits for digital computing applications. This is a substantially different application of multiple gate electrode structures than the device of the present invention.

A more pertinent example of a vertical prior art device is shown in FIG. 6 (U.S. Pat. No. 7,105,934). Prior art FinFET device 16, preferably fabricated on a Silicon-On-Insulator (SOI) starting substrate, utilizes multiple gates connected as a common node to control primary and secondary channel structures, and thereby has reduced extrinsic device series resistance. In the case of the device of FIG. 6, the utilization of a single gate node is advantageous for realizing digital circuit functions, the efficiency of which can be substantially limited by interconnect density considerations. In the case of analog and mixed-signal functions however, where interconnect density considerations are typically more relaxed, the co-modulation of differing adjoined channel structures may introduce non-linearity, thereby reducing the effectiveness of the device.

In spite of the improvements that have been discussed in the area of multiple-gate MOS Field Effect devices, a number of problems remain to be solved, particularly in the domain of CMOS analog and mixed-signal circuit applications. The device of the present invention addresses and solves a number of additional problems in the art.

SUMMARY OF THE INVENTION

Accordingly, it is one object of the present invention to provide an improved, castellated-gate MOSFET tetrode device capable of fully depleted operation.

It is another object of the present invention to provide such a device having drive current per unit area increases up to an order-of-magnitude or greater (>10×) than existing planar VLSI I/O devices.

Still another object of the present invention is to provide a high speed integrated vertical I/O device having a tunable input or output impedance through the use of one or more additional gate terminals.

Yet another object of the present invention is to provide a castellated gate MOSFET tetrode device capable of symmetrical operation with respect to the source and drain terminals.

Yet another object of the present invention is to provide a castellated gate MOSFET device with one or two shielding gates, thereby providing improved clock feedthrough immunity when the device is used as an analog sampling switch.

Still another object of the present invention is to provide a castellated-gate MOSFET tetrode device with reduced junction capacitance as compared to its planer counterpart for the same drive current.

A still further object of the present invention is to provide a castellated-gate MOSFET tetrode device which has a physical design layout and operational physical structure which is independent of the starting wafer type, that is bulk, SOI, epi, strained-surface, or otherwise engineered.

A still further object of the present invention is to provide a castellated-gate MOSFET tetrode device which has a physical design layout and operational physical structure which is substantially compatible with prior art castellated-gate MOSFET triode device fabrication sequences.

To achieve the foregoing and other objects and in accordance with the purposes of the present invention, as embodied and broadly described herein, a castellated-gate MOSFET tetrode device capable of fully depleted operation is disclosed. The device includes a semiconductor substrate region having an upper portion with a top surface and a lower portion with a bottom surface. A source region and a drain region are formed in the semiconductor substrate region, and a channel-forming region is also disposed therein between the source and drain regions. Trench isolation insulator islands, having upper and lower surfaces, surround the source and drain regions as well as the channel-forming region. The primary channel-forming region includes a plurality of thin, spaced, vertically-orientated conductive channel elements that span longitudinally along the device between the source and drain regions. A first gate structure is provided in the form of a plurality of spaced, castellated first gate elements interposed between the primary channel elements, and a first top gate member interconnects the first gate elements at their upper vertical ends to cover the primary channel elements. A first dielectric layer separates the primary conductive channel elements from the first gate structure. Either one or two Secondary channel forming regions are created in a predetermined manner longitudinally along the vertically-oriented conductive channel elements between the primary channel forming regions and the source and/or drain regions. One or two second gate structures are then provided in the form of additional pluralities of spaced, castellated second gate elements interposed between the secondary channel elements. A second top gate member interconnects the second gate elements at their upper vertical ends to cover the secondary channel elements. Finally, one or two second dielectric layers separate the secondary conductive channel elements from the second gate structure, thereby forming an integrated cascode device structure.

In one modification, the device further includes at least one electrically insulating material layer formed in the semiconductor region lower portion beneath the source and drain regions. In one form of this modification, the electrically insulating material layer is spaced below the bottom surface of the trench isolation islands to form a common semiconductor connection in the lower portion of the device. In addition, the electrically insulating material layer may selectively abut the bottom surface of the shallow trench isolation islands and the channel-forming regions.

In another modification of the invention, the source and drain regions of the device are preferably of dual-polarity, each being a composite of n-type and p-type dopant impurities.

In one further modification of the invention, the source and drain regions are each dually doped to create their dual polarity. In this form, the dopant of the primary channel-forming region is of a first conductivity type, the dopant of the upper portions of the source and drain regions is of a second conductivity type at a degenerate concentration, and the dopant of the lower portions of the source and drain regions is of the first conductivity type but of an order of magnitude greater than the dopant level of the primary channel-forming region.

In yet another alternate form of the invention, the dopant of the primary channel-forming region is of a first conductivity type. The dopant of the secondary channel-forming region may be of either a first or second conductivity type, differing polarities, and at dopant concentrations, up to degenerate levels, that may be set in a predetermined manner.

Another modification of the invention includes a castellated-gate MOSFET tetrode device which is capable of fully depleted operation and is substantially independent of starting wafer type. The device includes a semiconductor substrate region of a first conductivity type, having an upper portion with a top surface and a lower portion with a bottom surface. A dual-polarity source region is provided and has an upper highly doped portion of a second conductivity type and a lower highly doped portion of said first conductivity type but of a higher concentration level than that of said substrate region. Likewise, a dual-polarity drain region is also provided having an upper highly doped portion of a second conductivity type and a lower highly doped portion of said first conductivity type but of a higher concentration level than that of said substrate region. A channel-forming region is deposed between the source and drain regions, the primary channel-forming region including a plurality of thin, spaced, vertically-oriented conductive channel elements that span longitudinally along the device between the source and drain regions. Either one or two Secondary channel forming regions are created in a predetermined manner longitudinally along the vertically-oriented conductive channel elements between either ends of the primary channel forming regions, and the source and/or drain regions. Trench isolation insulator islands surround the dual-polarity source and drain regions as well as the channel-forming regions, and having upper and lower surfaces. A first gate structure is provided in the form of a plurality of spaced, castellated conductive first gate elements interposed longitudinally between and outside of the primary channel elements, and a first top gate member interconnecting the first gate elements at their upper vertical ends to cover the primary channel elements. A first dielectric layer serves to separate the primary conductive channel elements from the first gate structure. Furthermore, one or two second gate structures are then provided in the form of additional pluralities of spaced, castellated second gate elements interposed between the secondary channel elements. A second top gate member interconnects the second gate elements at their upper vertical ends to cover the secondary channel elements. To complete the integrated cascode device structure, a second dielectric layer separates the secondary conductive channel elements from the second gate structure. Finally, both first and second gate elements have a depth less than the lower surface of the shallow trench isolation islands.

Yet another modification of the invention includes a castellated-gate MOSFET tetrode device which is capable of fully depleted operation and is substantially independent of starting wafer type. The device includes a semiconductor substrate region of a first conductivity type, having an upper portion with a top surface and a lower portion with a bottom surface. A single-polarity source region is provided, which is a highly doped structure of a second conductivity type. Likewise, a single-polarity drain region is provided, also being a highly doped structure of a second conductivity type. A channel-forming region is deposed between the source and drain regions, the primary channel-forming region including a plurality of thin, spaced, vertically-oriented conductive channel elements that span longitudinally along the device between the source and drain regions. Either one or two Secondary channel forming regions are created in a predetermined manner longitudinally along the vertically-oriented conductive channel elements between either ends of the primary channel forming regions, and the source and/or drain regions. Trench isolation insulator islands surround the single-polarity source and drain regions as well as the channel-forming regions, and having upper and lower surfaces. A first gate structure is provided in the form of a plurality of spaced, castellated conductive first gate elements interposed longitudinally between and outside of the primary channel elements, and a first top gate member interconnecting the first gate elements at their upper vertical ends to cover the primary channel elements. A first dielectric layer separates the primary conductive channel elements from the first gate structure. In addition, one or two second gate structures are then provided in the form of additional pluralities of spaced, castellated second gate elements interposed between the secondary channel elements. A second top gate member interconnects the second gate elements at their upper vertical ends to cover the secondary channel elements. Completing the integrated cascode device structure, a second dielectric layer separates the secondary conductive channel elements from the second gate structure. Finally, both first and second gate elements have a depth greater than the lower surface of the shallow trench isolation islands.

An additional aspect of the invention includes a method of manufacturing a castellated-gate MOSFET tetrode device. The initial steps of the method are substantially the same as that of the referenced method for fabricating a Castellated-Gate MOSFET in a triode configuration, and consists of the steps of preconditioning a starting semiconductor substrate, and then applying active layer pad nitride masks to form shallow trench isolation islands in the substrate. A plurality of thin semiconductor channel elements are formed by etching a plurality of spaced gate slots to a first predetermined depth into the substrate. The slots are then filled with a dielectric material. An area of the dielectric material is then cleared out within the gate slots to form a gate slot spacer, followed by the deposition of a first gate dielectric. The slot regions are also filled with a first conductive gate material, and they are subsequently connected together at their upper end surfaces with a first top gate layer, thereby forming a primary channel structure. At this point, the ungated portion of the channel elements may be implanted, or otherwise doped to a predetermined concentration and/or conductivity type. Next, an optional second spacer structure is formed around the first gate stack. A source and a drain region are each implanted at opposite end portions of the spaced, channel elements, with the previously formed second spacer structure serving to mask intermediate channel forming regions between either end of the primary channel structure. A predetermined area of previously deposed and planarized Interlevel Dielectric (ILD) is cleared out, in addition to a specified vertical portion of the gate slot spacer structure, followed by the deposition of a second gate dielectric. Finally, the second group of slot regions are filled with a second conductive gate material, and connected together at their upper end surfaces with a second top gate layer, thereby forming a secondary channel structure, and completing the integrated cascode device.

A further modification of the invention includes a second method of manufacturing a castellated-gate MOSFET tetrode device. In the second method, the formation of the second spacer is no longer required to form self-aligned source and drain regions. Instead, a derived mask layer is employed in a processing step after the partially cleared gate slot regions have been filled with a first dielectric and a first conductive gate material. A composite gate structure is temporarily formed that incorporates masking features of the first gate and second gate. The first gate portion of the temporary composite gate defines the primary channel structure, and the remaining portion is utilized as a dummy gate with which to self-align the source and drain regions. After the source and drain structures have been fabricated, predefined areas adjacent to the first gate are cleared of material that includes previously deposed Interlevel Dielectric (ILD), composite gate conductor, and a specified vertical portion of the gate slot spacer structure. Finally, the second group of slot regions are filled with a second conductive gate material, and connected together at their upper end surfaces with a second top gate layer, thereby forming a secondary channel structure, and completing a second method with which to fabricate the integrated cascode device of the present invention.

BRIEF DESCRIPTION OF THE DRAWINGS

The accompanying drawings which are incorporated in and form a part of the specification illustrate preferred embodiments of the present invention and, together with a description, serve to explain the principles of the invention. In the drawings:

FIG. 10A is a cross-sectional view taken substantially along line 10A-10A' of FIG. 10;

FIG. 10B is a cross-sectional view taken substantially along line 10A-10A' of FIG. 10;

FIG. 10C is a cross-sectional view taken substantially along line 10A-10A' of FIG. 10;

FIG. 13 is a top view of a process step for patterning and etching a first gate stack using a first gate mask in the same embodiment of the present invention initially presented in FIG. 9, illustrating two similar orientations and one orientation 90° relative to the first two orientations to illustrate the complete structure of this step in making the embodiment;

FIG. 14 is a top view of another subsequent process step for forming a spacer, as well as source and drain regions, through the application of source and drain masks in the same embodiment of the present invention, illustrating two similar orientations and one orientation 90° relative to the first two orientations, to illustrate the complete structure of this step in making the embodiment;

FIG. 14A is a cross-sectional view taken substantially along line 14A-14A' of FIG. 14;

FIG. 17 is a top view of a subsequent process step for using a derived mask layer which incorporates both the first and second mask shapes in order to form a composite gate stack, in the second embodiment of the present invention illustrating two similar orientations and one orientation 90° relative to the first two orientations to illustrate the complete structure of this step in making the embodiment;

FIG. 18 is a top view of a subsequent process step for applying a second gate mask with which to remove the dummy portion of the composite gate stack by utilizing a multi-step anisotropic etch sequence, in the second embodiment of the present invention, illustrating two similar orientations and one orientation 90° relative to the first two orientations to illustrate the complete structure of this step in making the embodiment;

FIG. 18A is a cross-sectional view taken substantially along line 18A-18A' of FIG. 19;

FIG. 19 is a top view of the photolithography masking elements of the second embodiment of the present invention, illustrating two similar orientations and one orientation 90° relative to the first two orientations to illustrate the complete structure of the embodiment.

DETAILED DESCRIPTION OF THE EXEMPLARY EMBODIMENTS

Figure 2:
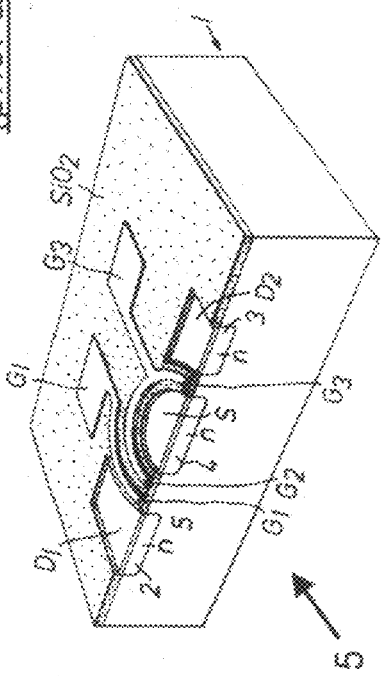
FIG. 2 illustrates a perspective view of a prior art planar field effect device which incorporates an integrated cascode structure.
Figure 4:
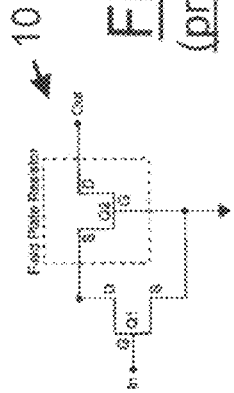
FIG. 4 illustrates a crossectional view and an equivalent circuit diagram of a prior art integrated cascode discrete field effect transistor device.
Figure 1:
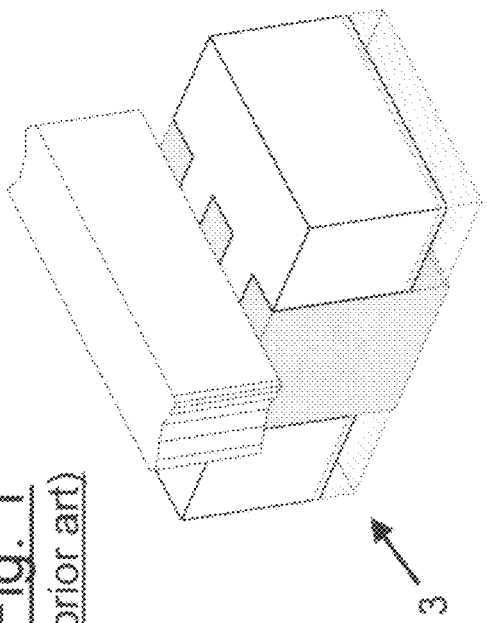
FIG. 1 illustrates a perspective view of one sub-section of the castellated gate tetrode device of the embodiment illustrated in FIGS. 9 and 9A.
Figure 3:
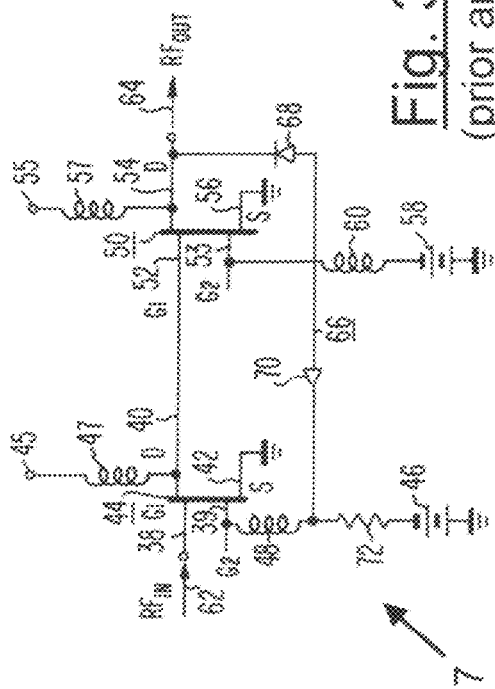
FIG. 3 shows a prior art circuit diagram which utilizes dual-gate field effect transistors to realize an RF mixer function.
Figure 5:
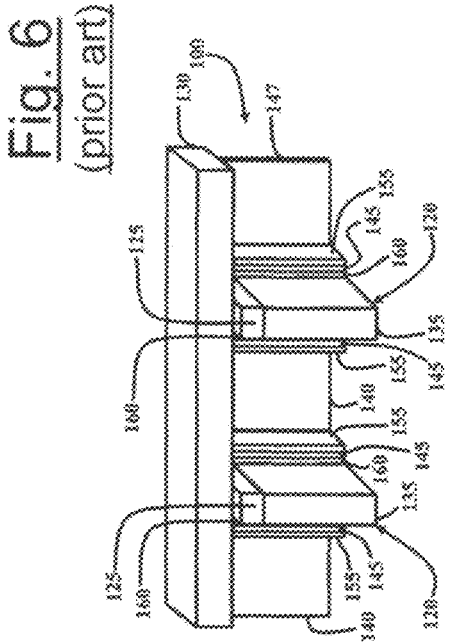
FIG. 5 illustrates a crossectional view of a prior art FinFET vertical field effect transistor structure, wherein multiple separated gates control a common first channel region.
Figure 6:
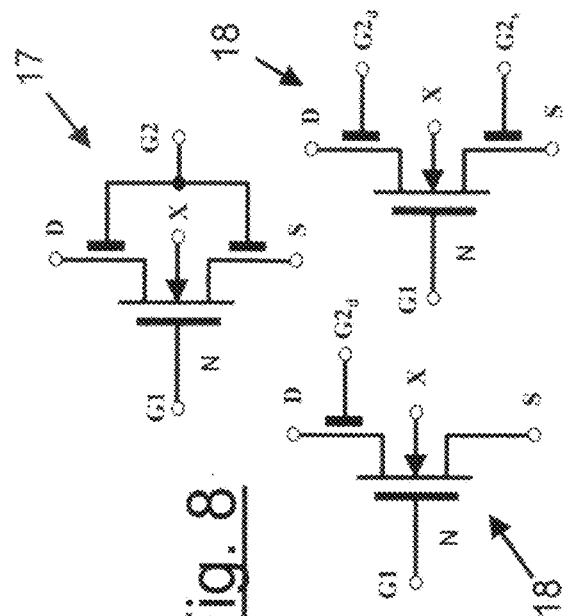
FIG. 6 illustrates a perspective view of a prior art FinFET vertical field effect transistor structure wherein multiple gate electrode elements, connected as a common node, control first and second channel regions.
Figure 7:
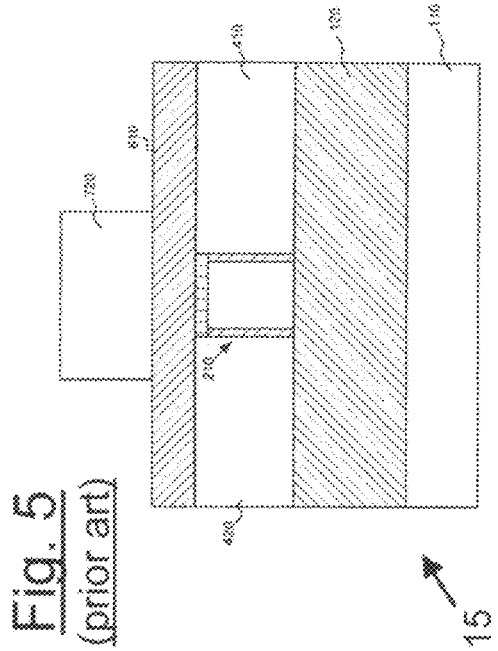
FIG. 7 illustrates a perspective view of one sub-section of the castellated gate tetrode device of the embodiment illustrated in FIGS. 9 and 9A.

In the field of castellated gate MOSFET devices, one attractive approach to the aforementioned problems in the area of analog and mixed-signal applications is to incorporate one or two additional gate structures so as to form an integrated cascode device. FIG. 7 illustrates in perspective view a subsection of an improved version 240 of the castellated gate MOSFET triode device 3 illustrated in FIG. 1. The improved castellated gate MOSFET tetrode 240 is capable of fully depleted operation, and has a first top gate electrode 32, as well as second top gate electrodes 115 which are separated from the first by a dielectric layer. First and second gate structures control primary and secondary channel structures (not shown), thus forming a compound device. As was the case of the prior art triode device 3, the improved device 240 of the present invention may incorporate dual-polarity source and drain structures consisting of self-aligned upper portions 58 and lower portions 62.

Figure 8:
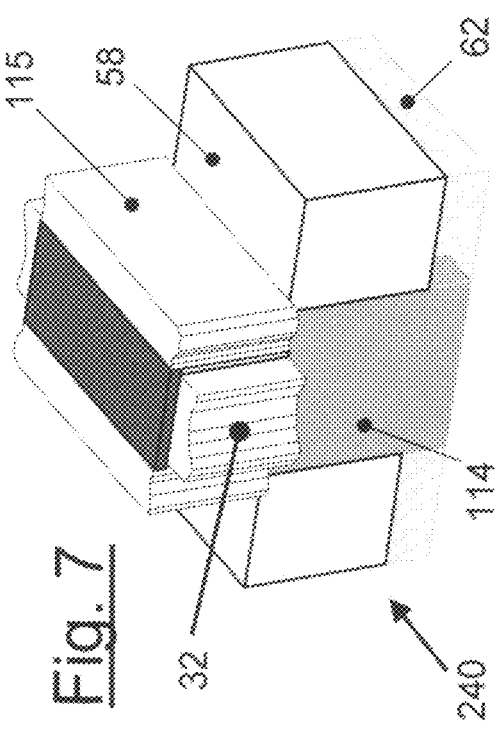
FIG. 8 illustrates three equivalent circuit symbols for the castellated gate tetrode device of the present invention, each representing a distinct embodiment.

The terminal characteristics of the MOSFET tetrode device of the present invention can be inferred from the equivalent circuit symbols shown in FIG. 8. In it's simplest embodiment, castellated gate MOSFET tetrode device 18 incorporates a second gate electrode ($G2_d$) on the drain side only, thus shielding the drain node (D) from the first gate (G1), and thereby reducing the Miller Capacitance when the device is utilized in a common source amplifier configuration. Castellated gate MOSFET tetrode device 17 incorporates second gate electrodes at both the drain and the source sides which are joined together as a common second gate node (G2). This symmetrical arrangement is useful when the device is utilized as an analog switch. Finally, castellated gate MOSFET tetrode device 18 incorporates independent second gate electrodes at both the drain ($G2_d$) and the source sides ($G2_s$), thereby providing the maximum flexibility of control.

In its preferred embodiment, the composite DC electrical behavior of the castellated-gate MOSFET tetrode device is dominated by the behavior of the primary channel structure. Consequently, the drive current improvement of the castellated-gate tetrode device over it's planar counterpart follows from the referenced prior art triode castellated-gate MOSFET, as described in the following equation $$P_{drv}\bigg|_{TG} \cong \beta \frac{n(2z+d)}{nd+(n+1)W_g} \cdot \left(\frac{L_{min}|_{PSG}}{L_{min}|_{TG}}\right)$$

where Wg is the width of the primary gate slots, d is the gate slot spacing (channel thickness), and $L_{eSG}$ and $L_{eTG}$ are the minimum channel lengths of a planer single-gate MOSFET and a tri-gated MOSFET, respectively. β represents the ratio of the multiple-gated and single-gated effective mobilities for the primary channel, and at a given threshold voltage, where $0.75<\beta<1.00$.

In the case of small-signal/AC behavior, the creation of a performance improvement metric for the castellated-gate tetrode, such as the previous equation, is a more complex undertaking as it depends on the design parameters of the secondary channel structure(s). Referring back to the case of the castellated gate tetrode device 18 in FIG. 8, if the secondary channel conductivity type and dopant levels are the same as the primary channel, the equivalent circuit can be reduced to a cascode consisting of a primary castellated-gate MOSFET triode, having negligible extrinsic resistive component ($R_{ext1}$), in series with a secondary castellated-gate MOSFET triode, also having negligible extrinsic resistive component ($R_{ext2}$), but with higher overlap capacitance ($C_{ov}$) to the output node. The secondary castellated-gate MOSFET triode normally operates under constant bias in this situation, and acts to shield the output node from the drain node of the primary castellated-gate device, thereby suppressing the Miller Effect with respect to primary device when the MOSFET tetrode is utilized in a common source amplifier configuration. Just as in the case of vacuum tube technology, the castellated gate MOSFET tetrode will exhibit a larger gain-bandwidth product (GBW) than an equivalently designed castellated gate MOSFET triode.

Figure 9:
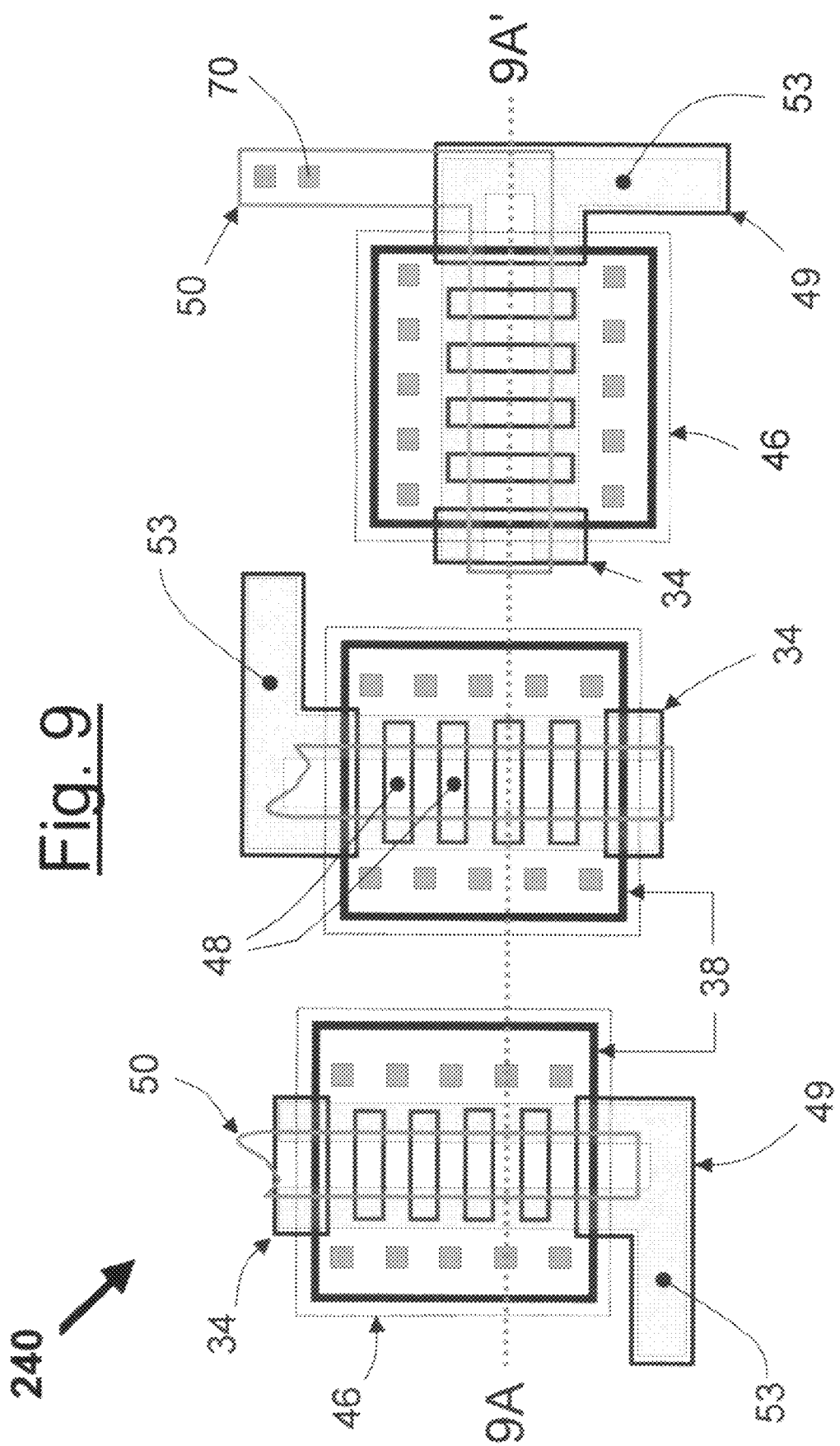
FIG. 9 is a top view of the photolithography masking elements of a first embodiment of the present invention, illustrating two similar orientations and one orientation 90° relative to the first two orientations to illustrate the complete structure of the embodiment.
Figure 9A:
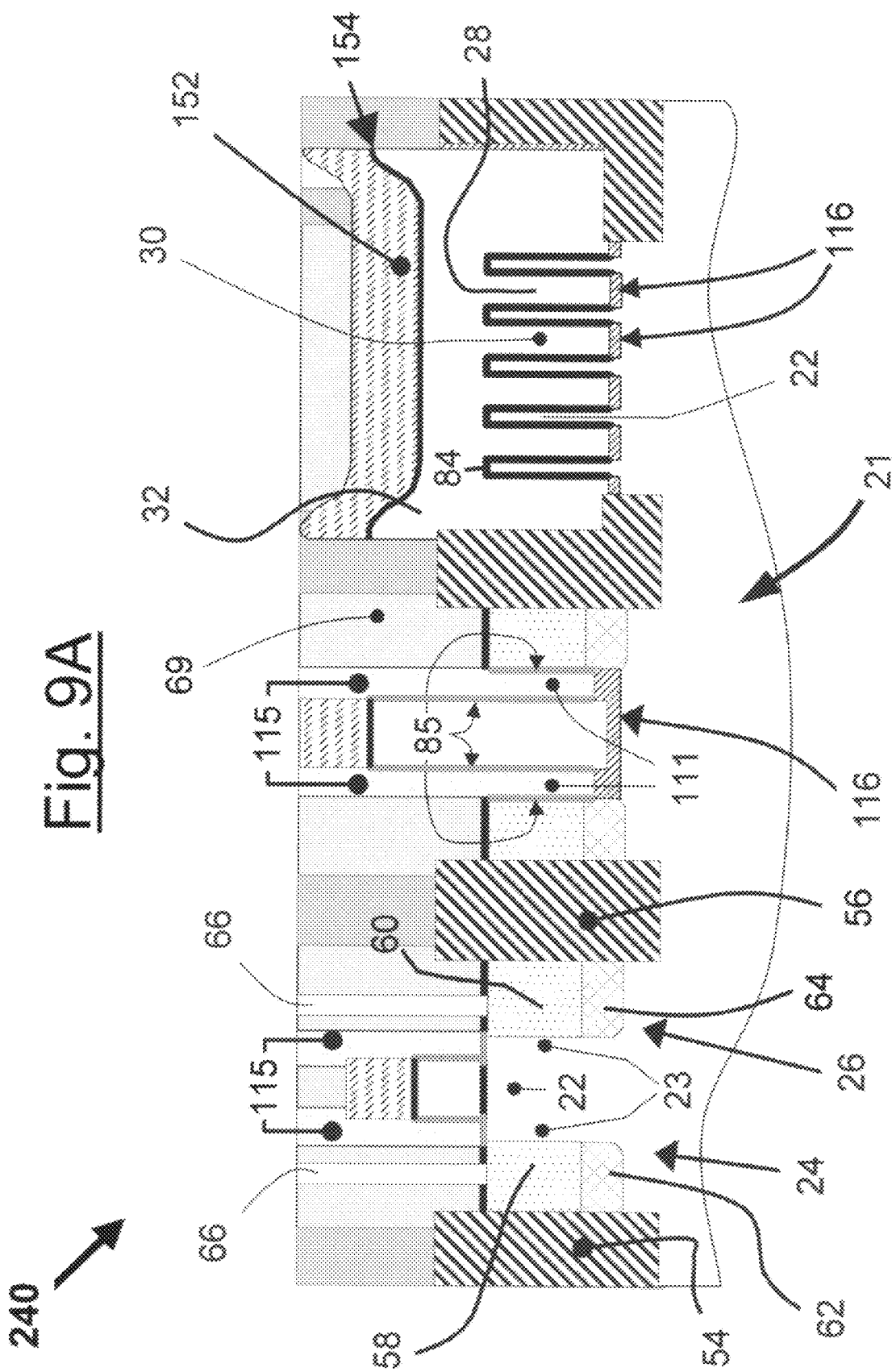
FIG. 9A is a cross-sectional view taken substantially along line 9A-9A' of FIG. 9.

With the general characteristics of the castellated gate MOSFET tetrode device introduced, a more detailed and specific embodiment of the device of the present invention will be described. Referring now to FIGS. 9 and 9A, a version of the invention is illustrated having a "tri-gated" primary channel, along with its photo masking layers in one possible embodiment using a low-doped bulk silicon substrate as the starting material. FIG. 9 illustrates one device in two similar orientations and then in an orientation 90° relative to the first two orientations to illustrate the complete structure from a top view as well as in cross-section as illustrated by FIG. 9A. The device 240 includes a silicon substrate wafer 21 and a plurality of thin, adjoined silicon channels 22,23 that span the distance between a source 24 and a drain 26. Just as in the case of the prior art castellated MOSFET triode, the primary channels 22 are formed by etching gate slots 28 into the active silicon, filling the slots with a dielectric material, preferably oxide, clearing out an area of the dielectric material within the gate slots to form a spacer 114, deposing a first gate dielectric 84, and then filling the slot regions with a first conductive gate material to form a plurality of vertical, spaced first gate elements 30 which are connected together by a first top gate 32. Subsequently, a secondary plurality of gates are patterned after the formation of the source and drain structures 24,26. This is achieved by applying a masking layer 53 which overlaps the gate slot masks 48 in the direction of channel length, thereby removing the remaining portion of the spacer structure 114. Next, a second gate dielectric 85 is deposed over the secondary channel elements 23. The device structure is completed by deposing and etching back a second conducting material to form the second plurality of gates 111, along with a second top gate 115. As shown in FIG. 9A, the primary and secondary silicon channels 22,23 are preferably contiguous with the semiconductor material of the original starting wafer 21 from which they were fabricated. As such, they are continuously connected to the starting wafer both electrically and thermally.

The source/drain structure 24, 26 of the device 240 is preferably a composite of both N-Type and P-Type impurities, that is, they are of dual-polarity. The depth and thickness of the source and drain implant layers 24, 26 and their relation to the depth of the gate slots 28 are also key parameters for the proper operation of the device. In the example of FIGS. 9 and 9A, and in the case of a device of NMOS polarity, the upper portions 58, 60, respectively, of the source and drain regions 24, 26 are degenerately doped n-type. This forms an actual p-n junction to the body of the NMOS version of device 240, and an electrical connection to the adjoined channels 22,23 of the device. The lower portions 62, 64, respectively, of the source and drain regions 24, 26 are heavily doped p-type in the NMOS version, such that the peak of the doping profile is roughly coincident with the bottom gate oxide 116. This arrangement forms a channel stop by raising the device threshold near the bottom of the gate electrode, and greatly reduces a source of electrons with which to form an inversion layer at the lower surface of the bottom gate structure 116.

Figure 10:
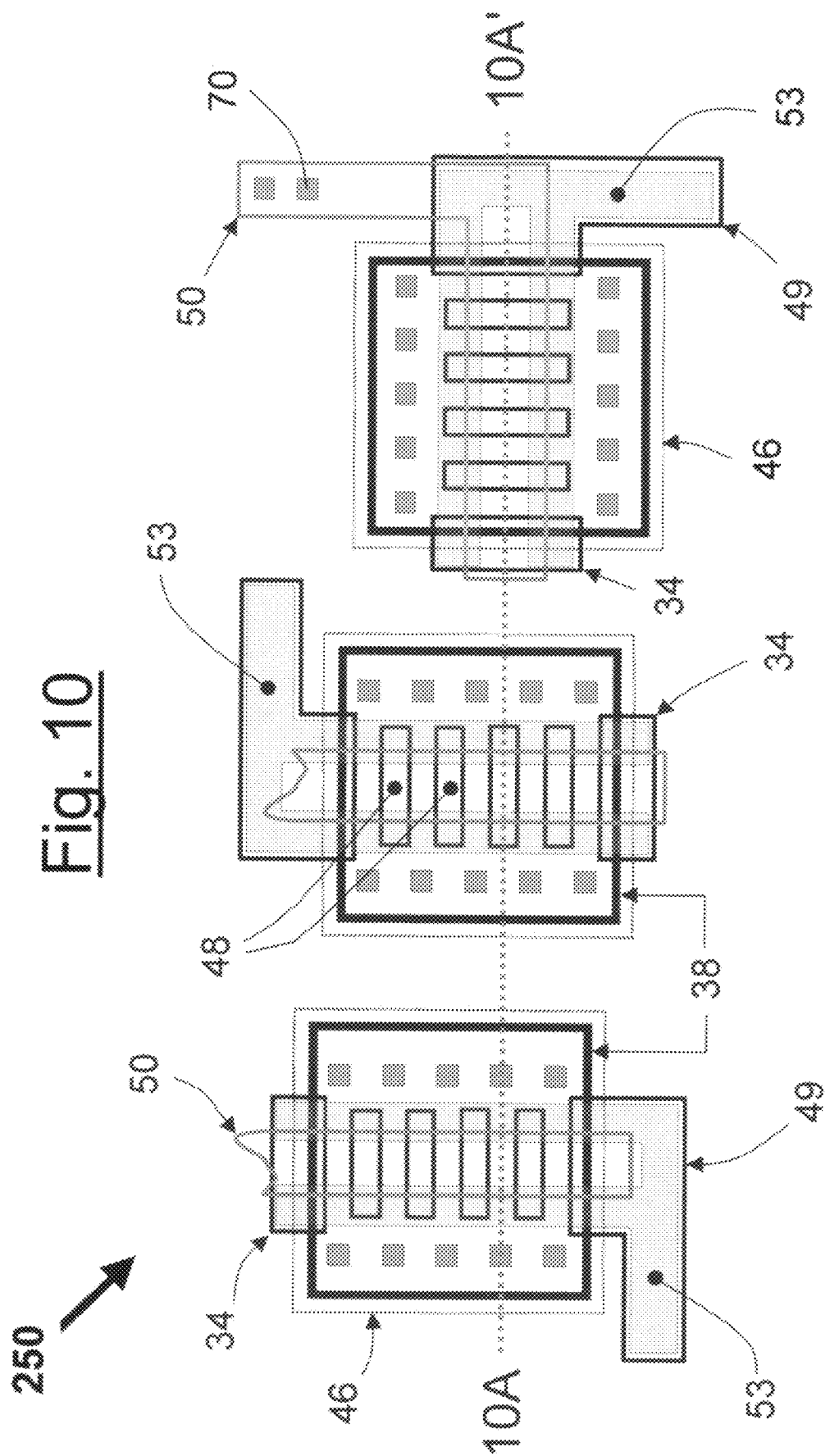
FIG. 10 is a top view diagram of the common photolithography masking elements of second, third, and fourth embodiments of the present invention, illustrating two similar orientations and one orientation 90° relative to the first two orientations to illustrate the complete structure of the embodiment.

FIGS. 10 and 10A illustrate a second device embodiment 250 of the disclosed device invention using a starting substrate 78 which has a dielectric layer 77 in a lower portion. A Silicon-On-Insulator (SOI) wafer would be an example of such a starting substrate, and can be produced using a variety of methods. Note that the device mask layout remains substantially the same as the case of the device 240 with the bulk starting wafer 21 shown in FIGS. 9-9A. Substantially similar to the bulk silicon substrate device 240, the device 250 includes a plurality of adjoined primary and secondary silicon channel elements 22,23 that span the distance between a source region 24 and a drain region 26. These primary and secondary channels are controlled by first and second pluralities of gate elements 30,111, respectively, which are separated from the channels using first and second gate dielectrics, 84,85.

As shown in FIG. 10A, the dielectric layer 77 of device embodiment 250 is spaced below the bottom surfaces of the Shallow Trench Isolation islands 54,56. In another embodiment 252, shown in FIG. 10B, the device can be fabricated such that the bottom surfaces of the Shallow Trench Isolation islands 54,56 abut the dielectric layer. In general, there are advantages to leaving a common silicon connection 81, thus enabling the use of body contacts which can be employed to eliminate device snapback problems as well as provide a path of higher thermal conductivity with which to dissipate heat.

In yet another embodiment 260 of the device of the present invention, the secondary channel elements 23' have the same dopant concentration as the source and drain regions 24,26 (see FIG. 10C). This is accomplished by simply aligning the source and drain regions to the outer edges of the primary channel 22 prior to the construction of the second gate elements 111. In this configuration, the secondary channels 23' function as gated resistors, with the second gate structure 111,115 providing shielding between the primary gate and the source and/or drain nodes 24,26.

At this point, it should be clear that the device described in the foregoing discussion may be constructed using a variety of material types and methods. For example, the starting substrate 21 of FIG. 9A may be selected from a group that includes, but is not limited to, bulk, epitaxial, or bonded silicon wafers. The substrates may additionally include engineered substrates containing strained silicon layers and/or silicon-germanium heterostructures as well as material systems other than silicon, including Silicon Carbide (SIC), Gallium Nitride (GaN), Gallium Arsenide (GaAs), and Indium Phosphide (InP), which structurally may be epitaxial, bonded, or otherwise engineered. In addition, the substrates may incorporate predefined regions of differing material types within which the device of the present invention is deposed. These predefined regions may be specified by a physical design lithography mask which is substantially incorporated with the physical design masks of the disclosed device. Alternately, the predefined regions may exist a priori, and the device of the disclosed invention is simply aligned and deposed within those regions using methods known in the art.

Similarly, the deposed components of the device of the present invention can also be selected from a wide variety of material types. For example, in the silicon realization of the device described in FIGS. 9-9A, the first gate dielectric 84 is preferably composed of silicon dioxide ($SiO_2$), however other oxides or dielectrics may also be used including lanthanum oxide, hafnium oxide, oxynitride (ONO), or silicon nitride ($Si_3N_4$). Likewise, the deposed first and second gate conductors may preferably be composed of n-type insitu-doped polysilicon, however mid-gap metal gates such as tungsten, titanium, tantalum or composites thereof, could also be used with appropriate changes to processing conductions.

An additional aspect of the present invention is the method with which the castellated gate MOSFET tetrode is fabricated. Now that the structural characteristics of the device of the present invention have been thoroughly described, a more detailed and specific description of fabrication methods will now be provided.

Method 1

Figure 11:
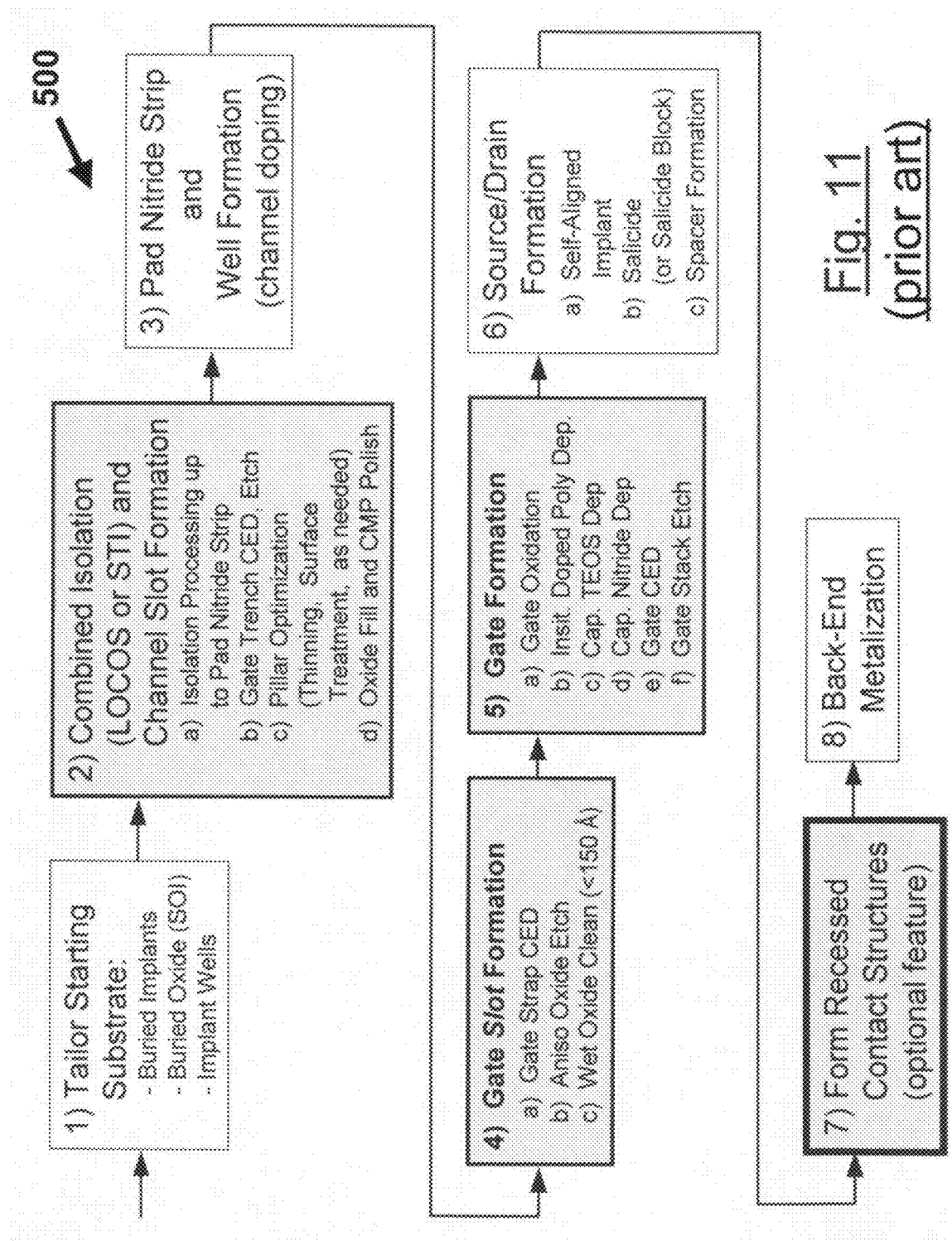
FIG. 11 is a generic flow diagram illustrating one basic process for fabricating a prior art castellated MOSFET triode device.

As a reference, FIG. 11 illustrates a generic process flow 500 for fabricating a prior art castellated gate MOSFET triode which shares similar structural characteristics with the device of the present invention. Now referring to FIG. 12, a generic process flow 610 is illustrated which can be used to fabricate a castellated gate MOSFET tetrode device in accordance with the present invention, such as the first embodiment 240, and further derivative embodiments, 250,252,260. More generally, it should be understood that the processing steps disclosed herein are adaptable to any device covered by the claims of the present invention.

Figure 12:
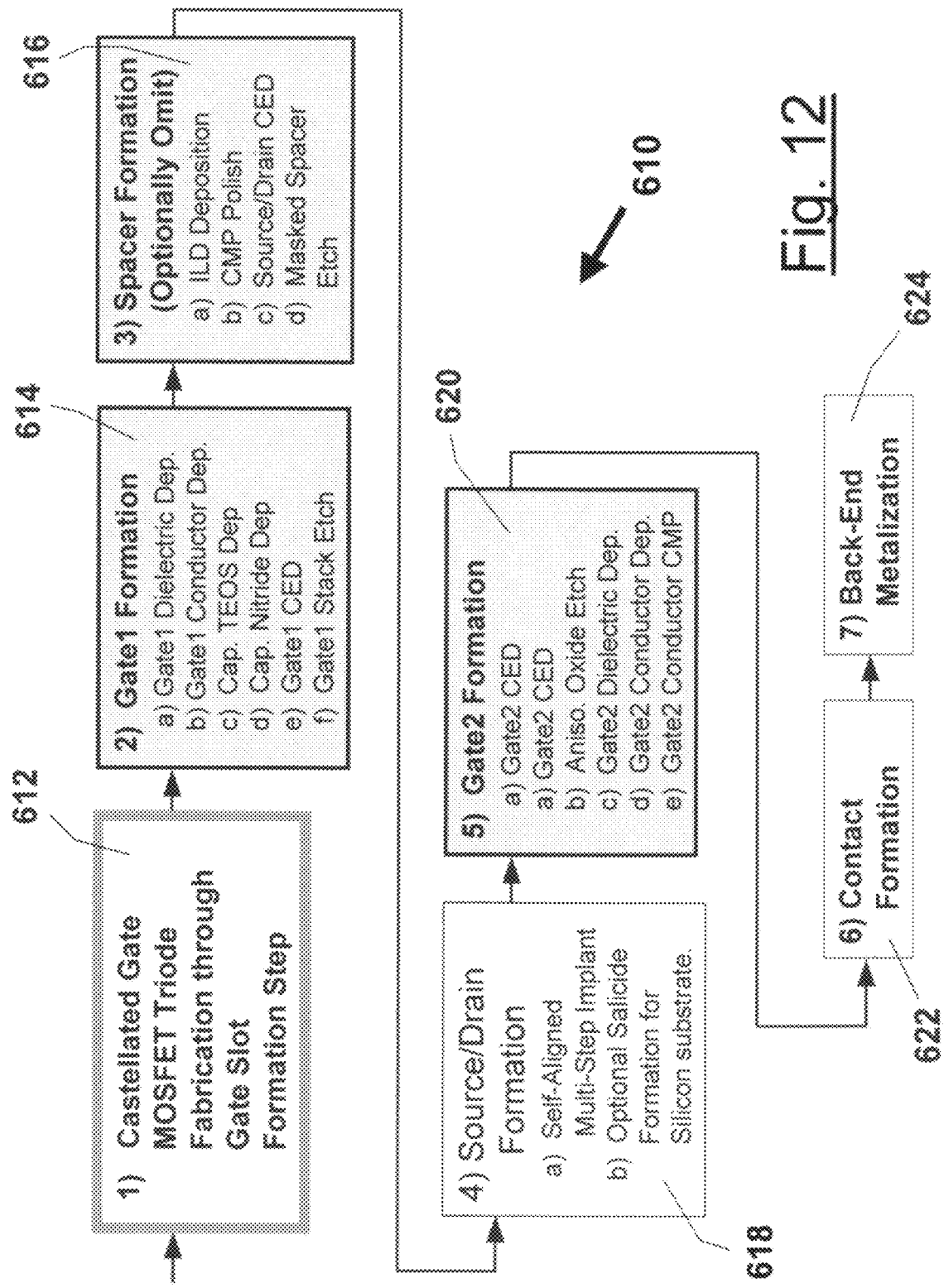
FIG. 12 is a generic flow diagram illustrating one basic process for fabricating a castellated gate tetrode device in accordance with the present invention, including the new flow's relationship to the prior art flow of FIG. 11.

As shown in FIG. 12, the initial steps 612 of the fabrication sequence 610 are substantially the same as the first four steps of fabrication sequence 500 used to construct a prior art castellated gate MOSFET triode device. In summary, these initial steps include the selection of a starting substrate 21, preprocessing steps associated with defining doping profiles and levels, formation of dielectric filled channel defining slots that reside within predefined active areas, and finally the removal of a predefined portion of the dielectric spacer 114 to a predefined depth having a bottom oxide 116, thereby forming the primary channel of the integrated cascode device of the present invention. Following the completion of these initial steps, the fabrication sequence proceeds to a set of steps by which the first gate is deposed and patterned.

Proceeding to the Gate 1 formation step 614 of the fabrication sequence, a first gate dielectric 84 is formed, preferably of silicon dioxide (SiO2) or oxynitride (ONO), although other dielectrics may also be used. These include but are not limited to hafnium oxide, lanthanum oxide, or silicon nitride (Si3N4). The deposed first gate dielectric layer 84 in the preferred embodiment will have a thickness (Tox) in the range of 50 to 350 angstroms in order to support operating voltages (Vdd) in the range of 1.8 to 5.0 volts. After the formation of the first gate dielectric 84, a gate stack is disposed consisting of a gate conductor, an oxide (preferably BPTEOS) 154 which will serve as an etch stop, and a silicon nitride (Si3N4) cap 152. The silicon nitride film 152 has significant ion-implant stopping power as the result of its higher material density. This feature is required in order to perform the self-aligned source/drain implants without counter-doping non-metal gate materials or the device channel itself. It should be noted that other gate-stack structures compatible with the preferred embodiment are possible, including the formation of a polycide on a polysilicon gate conductor prior to the application of the nitride cap layer.

Figure 13A:
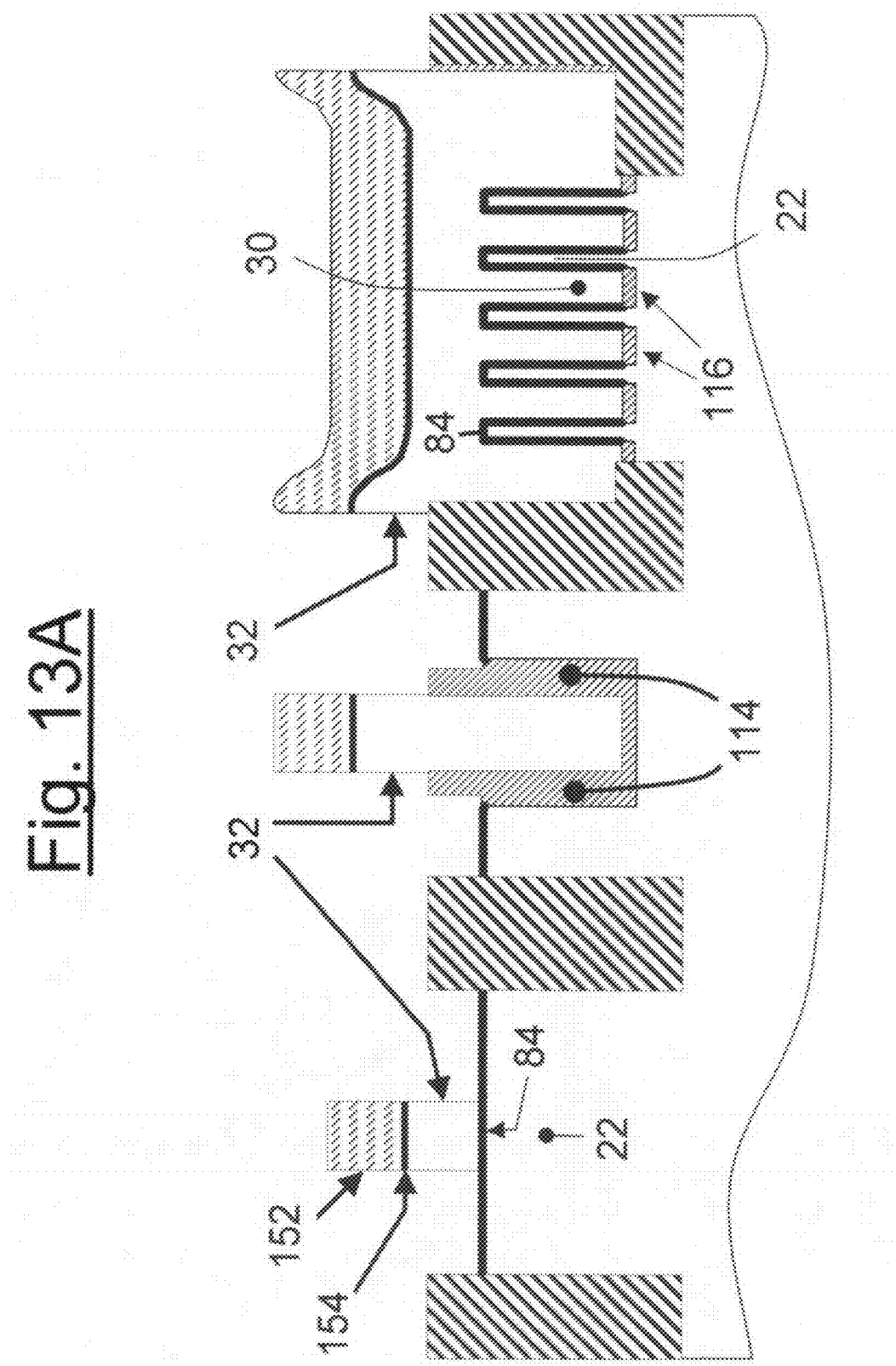
FIG. 13A is a cross-sectional view taken substantially along line 13A-13A' of FIG. 13.

With the gate stack in place, the next step in the fabrication sequence 610 for the preferred embodiment is to pattern a photoresist layer, with the possible inclusion of the previously referenced anti-reflective coating, using the first gate mask 50, illustrated in FIG. 13. A three-step etch sequence is preferably performed beginning with the silicon nitride cap 152, followed by the oxide layer 154, and then finally the gate conductor. This procedure may be performed on a multi-chamber etch tool such as the Applied Materials Centura etch platform. The resulting structure, minus the photoresist which is well known to the art, is shown in FIG. 13A.

In the next step of the fabrication sequence, a spacer is formed 616 around the top first gate 32 in order to facilitate the creation of one or two secondary channels 23. In general, this procedure involves deposing a dielectric, preferably oxide, in a uniform layer over the wafer, and then etching back the deposed material, leaving the spacer structures around features that protrude from the surface of the wafer, one of which is the first top gate. Alternate approaches can also be taken, including combining the spacer procedure 616 and the source/drain formation procedure 618, as will be seen next.

With the cap nitride layer 152 still in place, a spacer 119 and self-aligned source and drain junctions 24, 26 will be formed in a combined sequence through the application of the source and drain masks 46, as depicted in FIGS. 14-14A. Following the deposition and planarization of a deposed dielectric, photoresist 190 is applied and patterned using the source/drain masks 46. As discussed previously, the source and drain structures 24, 26 of the device of the present invention preferably include, respectively, upper portions 58, 60 and lower portions 62, 64. In the case of an N-type device 20, the dopant-peak of the lower portions 62, 64 would be at approximately the same depth as the bottom gate oxide 116, discussed previously with respect to the trench formation process steps. In the case of an NMOS MOSFET tetrode, the lower portions 62, 64 of the source and drain implants 24, 26 are preferably of the p+ conductivity type and can be formed using boron in the form of B11 or B12. The upper portions 58, 60 of the source and drain junctions 24, 26 are preferably of an n+ conductivity type for an NMOS MOSFET tetrode device, and are preferably formed using phosphorous (P), arsenic (As), or other donor implant species individually or in combination. After the source and drain structures have been fabricated, additional processing may be performed, including the optional removal of the capping nitride layer 152 in a bath of hot phosphoric acid or other appropriate agent.

Figure 15A:
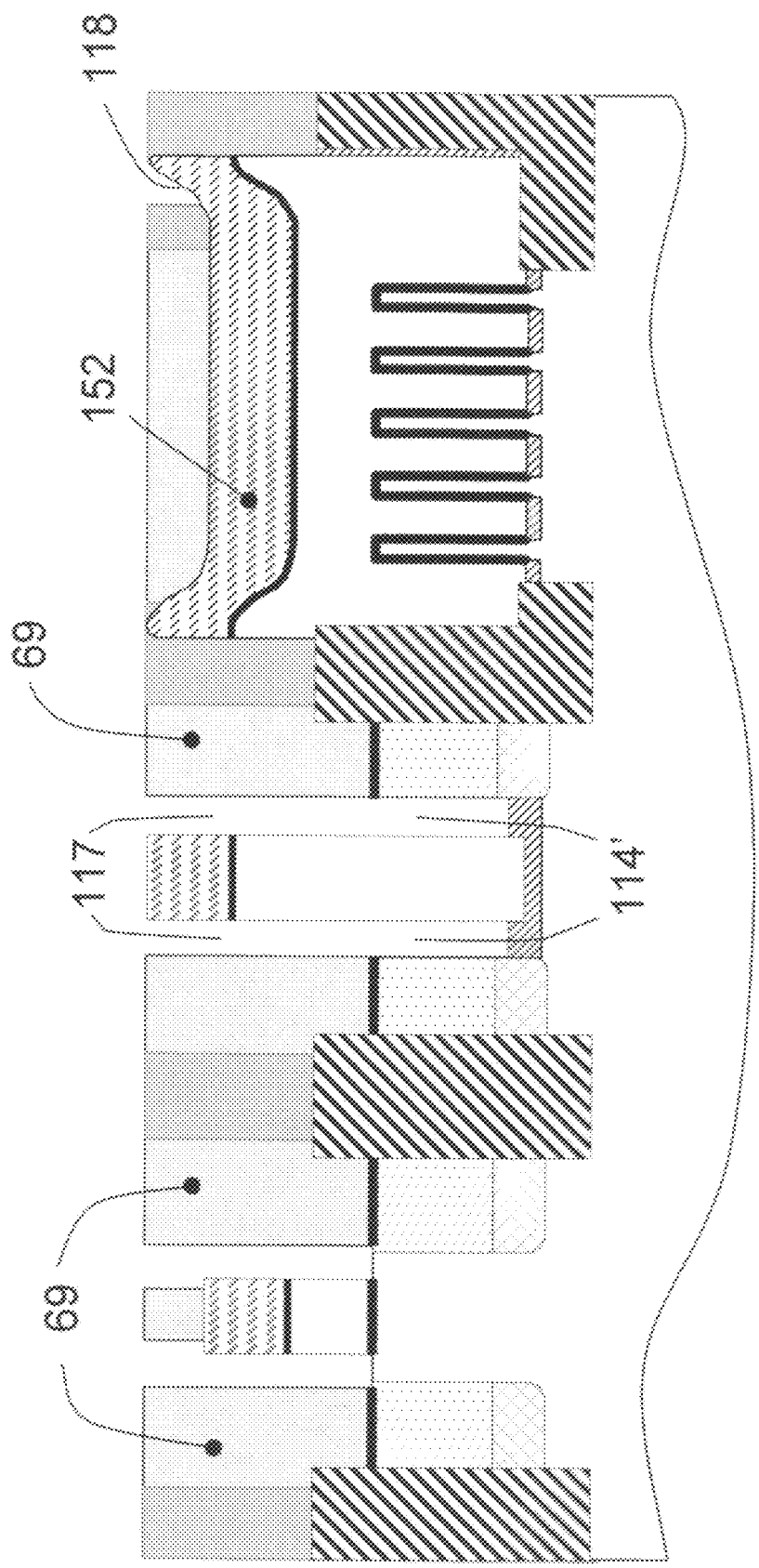
FIG. 15A is a cross-sectional view taken substantially along line 15A-15A' of FIG. 15.
Figure 15B:
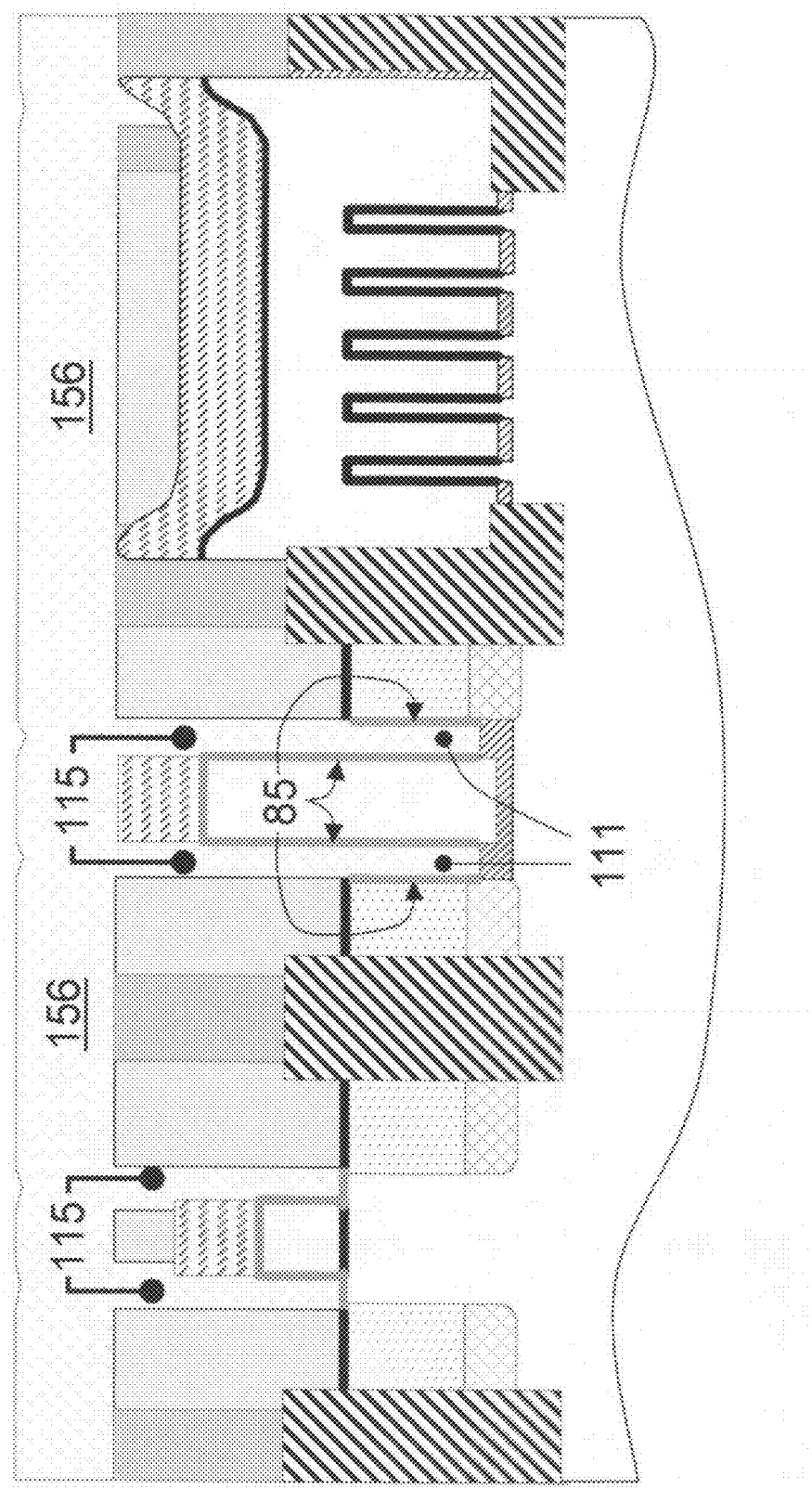
FIG. 15 is a top view of yet another subsequent process step for patterning and etching vias with which to form a second gate using a second gate mask in the same embodiment of the present invention, illustrating two similar orientations and one orientation 90° relative to the first two orientations, to illustrate the complete structure of this step in making the embodiment.

The application of the spacer 119 in the third procedure 616 of the fabrication sequence serves to self-align the source and drain regions at a predetermined distance laterally from the primary channels 22, thereby facilitating the definition of the secondary channels 23. As depicted in FIGS. 15-15A, following the fabrication of the source and drain structures, another interlevel dielectric layer (ILD), preferably oxide, is deposed and polished-back, preferably using Chemical-Mechanical-Polishing (CMP). At this point, second gate masks 53 (see FIG. 15) are used to pattern photoresist, and a multi-step etch procedure is used to clear out predefined areas 114' and 117 from regions that include ILD 69, top first gate spacer 119, and gate slot spacer 114. Finally, as shown in FIG. 15B, a second gate dielectric 85 is deposed, followed by a second gate conductor material 156. The second gate conductor material is then polished back to form the second top gate 115, as well as pluralities of second gate elements 111.

Contact formation and wiring steps are now performed in the usual manner known in the art to create circuitry, with the resulting final structure illustrated in FIGS. 9 and 9A. It should be noted at this point that if a SOI wafer is used as a starting substrate, the same process steps summarized in FIG. 12, along with masking layers shown in FIG. 9 (and repeated in FIG. 10), are used to create the structure illustrated in FIGS. 10A and 10B. Similarly, the fabrication sequence of FIG. 12 can be used with the spacer formation in procedure 616 omitted to produce the embodiment 260 of FIG. 10C. In this embodiment, the secondary channels of the integrated cascode have been replaced with gated resistors 23'.

Method 2

Figure 16:
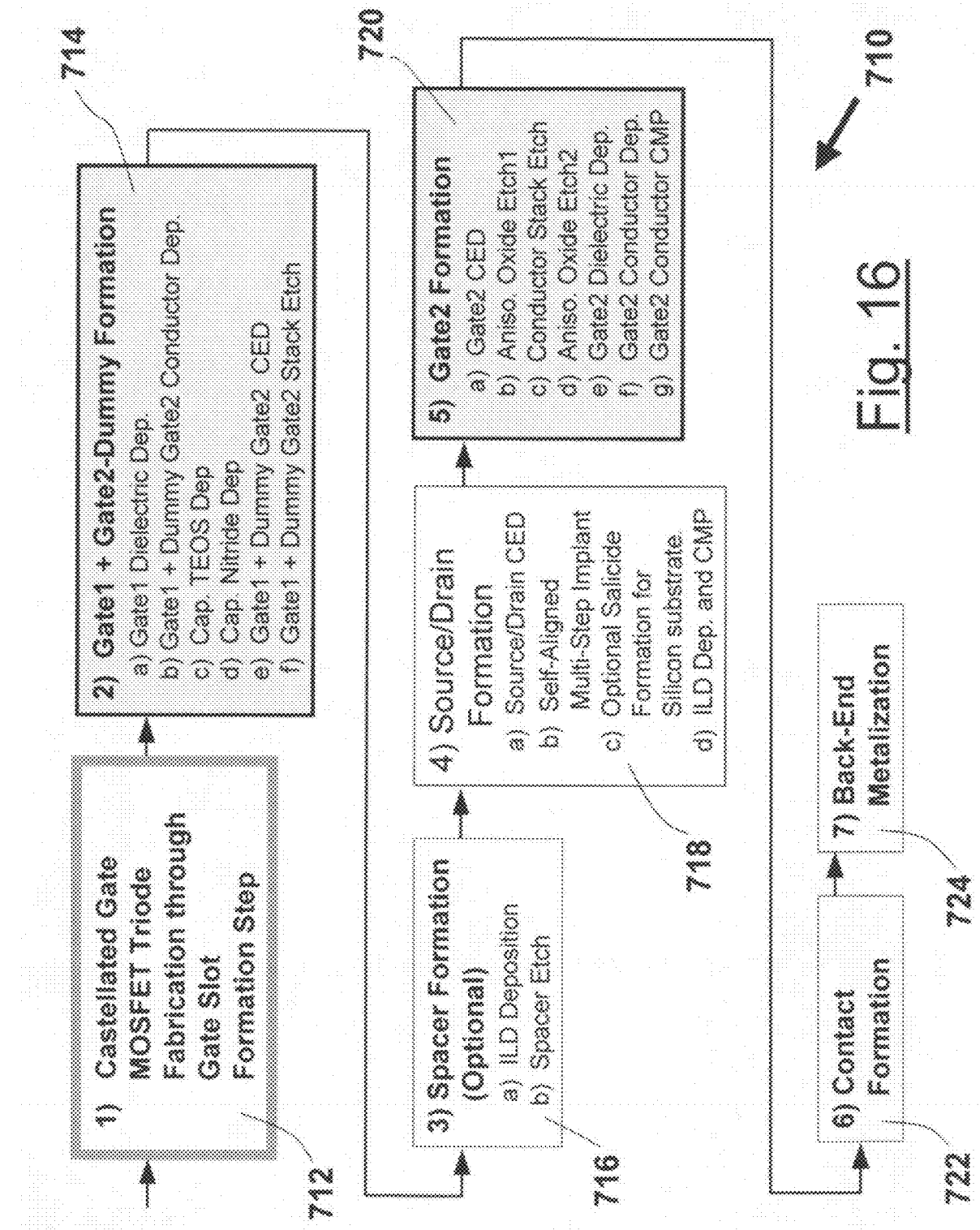
FIG. 16 is a generic flow diagram illustrating as second basic process for fabricating a castellated gate tetrode device in accordance with the present invention, including the new flow's relationship to the prior art flow of FIG. 11.

Other embodiments of the device constructed in accordance with the present invention can be produced using a second fabrication sequence. In this sequence, a procedure is incorporated whereby a composite gate structure is formed consisting of the first gate, as well as a remaining portion which acts as a dummy gate with which to self-align the source/drain structures to the secondary channel(s). This second method is summarized in FIG. 16, and will now be described.

Just as in the case of the first method 610, the initial steps 712 of the second fabrication sequence 710 (see FIG. 16) are substantially the same as the first four steps of fabrication sequence 500 (FIG. 15) used to construct a prior art castellated gate MOSFET triode device. Moving forward to the next procedure 714 in FIG. 16, the first gate dielectric 84, preferably oxide, is deposed over the primary channel 22 in much the same way as the first method 610. Also, as in 614, a gate stack is disposed consisting of an n-type insitu-doped polysilicon conductor, an oxide (preferably BPTEOS) 154 which will serve as an etch stop, and a silicon nitride (Si3N4) cap 152. At this point in the procedure 714, the second fabrication sequence diverges, as will be seen next.

Figure 17A:
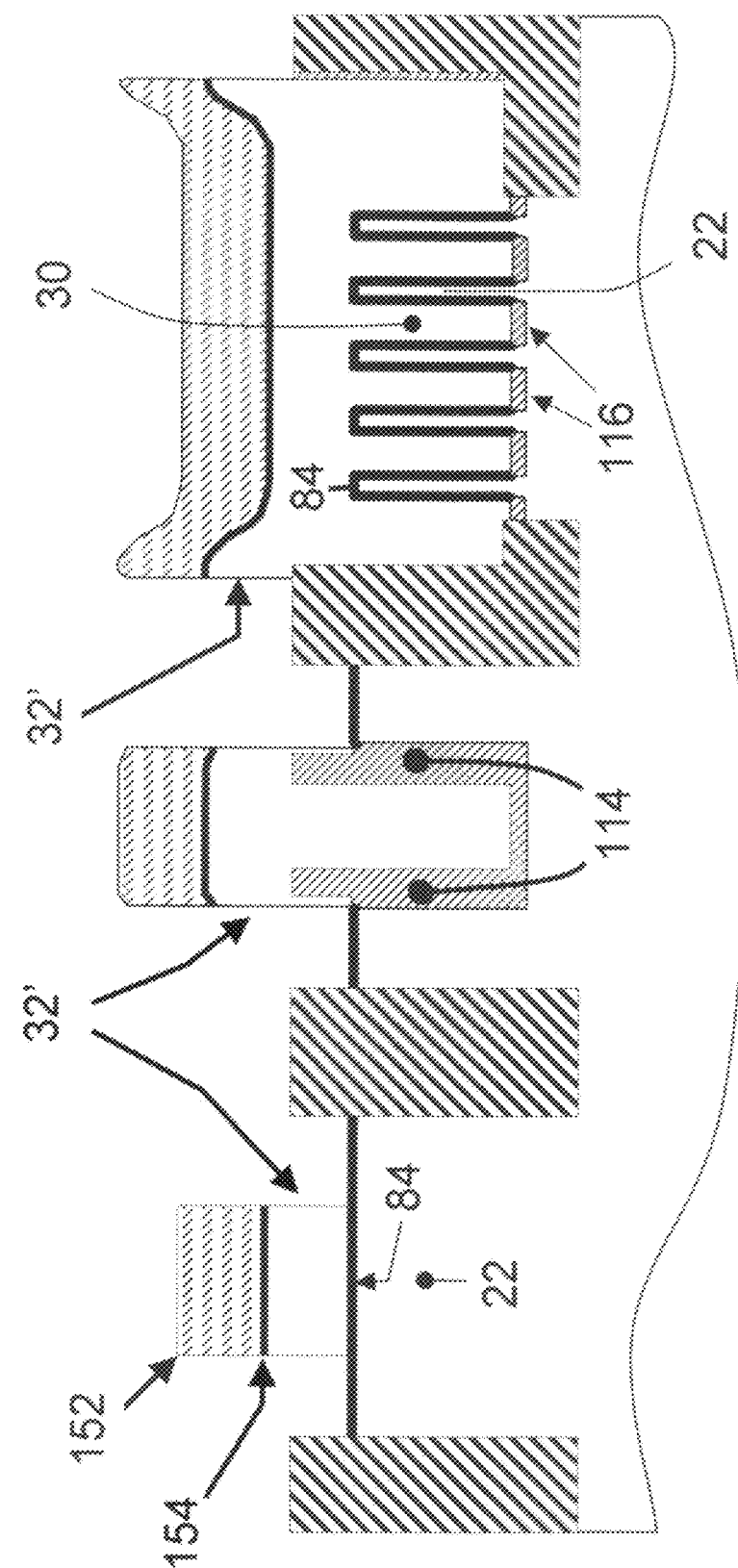
FIG. 17A is a cross-sectional view taken substantially along line 17A-17A' of FIG. 17.

With the gate stack in place, the next step in the composite gate formation procedure 714 is to apply a derived mask layer 160 (see FIG. 17); which includes the features from first gate 50 and second gate 53 masks. Using a technique illustrated previously in FIG. 13A, a multi-step anisotropic etch procedure is now executed, yielding the result of FIG. 17A. As shown in FIG. 17A, a composite gate structure has been produced which consists of the first gate elements 30, a dielectric layer 84 surrounding the primary channels 22, and a remainder 32' which will serve as a hard mask with which to self-align the source/drain structures in the following procedure.

The presence of the composite gate structure now makes the spacer formation procedure 716 an unnecessary sequence for defining the secondary channel, and therefore it can be omitted. Referring back to FIG. 16, a subsequent procedure 718 will be used to form self-aligned source and drain regions in the same manner as depicted in FIGS. 14-14A of the first method 610. With the formation of the source and drain structures completed, the capping nitride layer 152 may be optionally removed in a bath of hot phosphoric acid or other appropriate agent. In the final step of the procedure 718, an ILD layer, preferably oxide, is deposed and planarized.

Figure 19A:
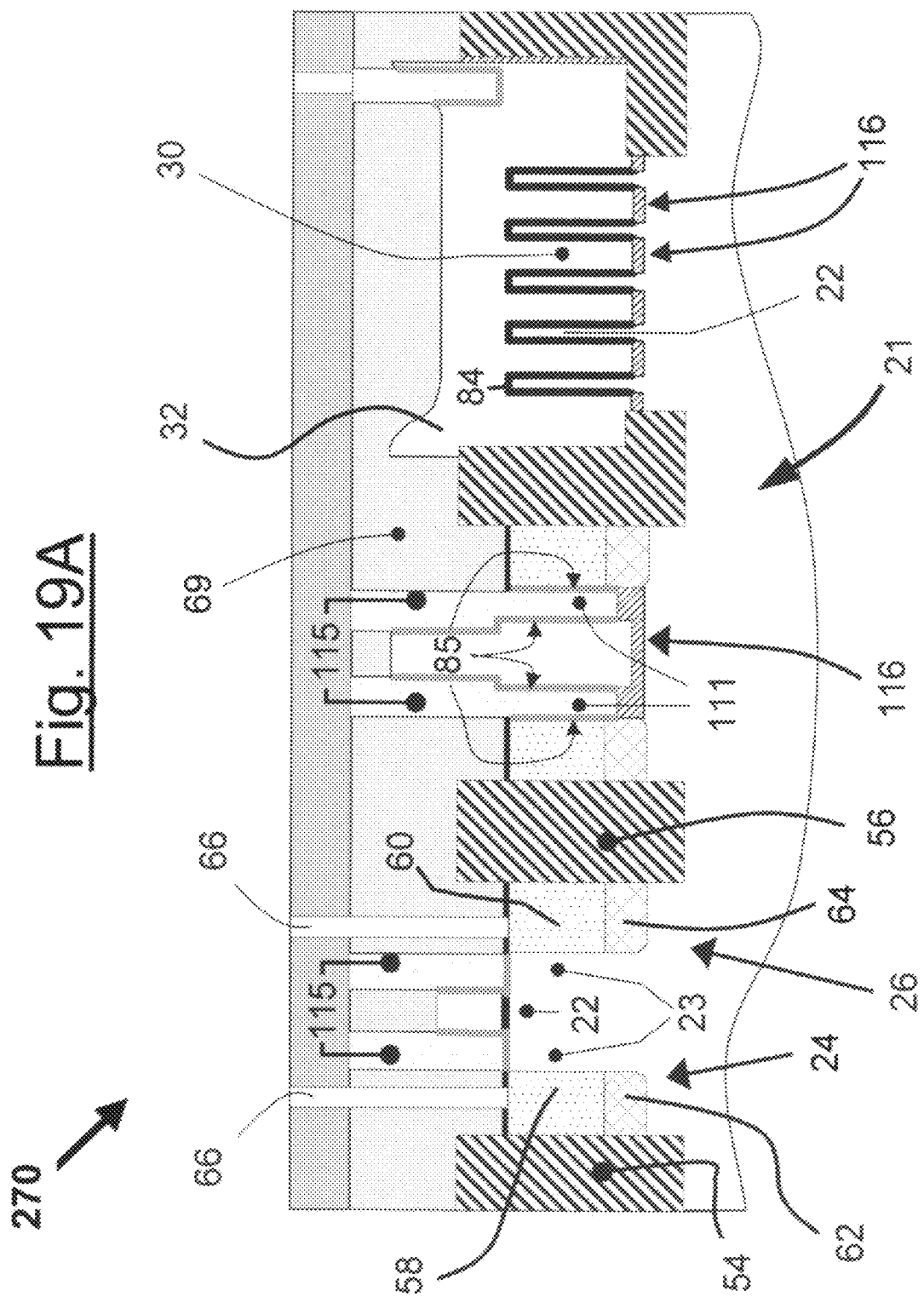
FIG. 19A is a cross-sectional view taken substantially along line 19A-19A' of FIG. 19, illustrating the completed form of the second embodiment of the present invention.

Referring now to FIGS. 18-18A, the final key steps 720 of the second fabrication sequence begin with the patterning of photoresist 190 using the second gate mask 53. Next, a multi-step etch process is applied to clear out areas 117 and 114' from regions that include the ILD 69, the remaining dummy gate stack material 32', and the gate slot spacer 114. Finally, the procedure 720 to construct the second gate is completed by deposing a second gate dielectric 85, followed by a second gate conductor material (preferably tungsten), and polishing back the second conductor material using CMP. The end product of these steps is the formation of the second top gate 115, as well as pluralities of second gate elements 111. As seen earlier in the first fabrication sequence (Method 1), contact and wiring structures can now be formed in the usual manner known in the art to create circuitry, with the resulting final structure illustrated in FIGS. 19 and 19A.

The foregoing description and the illustrative embodiments of this invention have been described in detail in varying modifications and alternate embodiments. It should be understood, however, that the foregoing description of the present invention is exemplary only, and that the scope of the present invention is to be limited to the claims as interpreted in view of the prior art. Moreover, the invention illustratively disclosed herein suitably may be practiced in the absence of any element which is not specifically disclosed herein.

I claim:

1. A method of manufacturing a castellated-gate MOSFET tetrode device comprising the steps of:
   pre-conditioning a starting semiconductor substrate;
   applying active layer pad nitride masks to form trench isolation islands in said substrate;
   forming a plurality of channel elements by etching a plurality of spaced gate slots to a first predetermined depth into said substrate;
   filling said slots with a dielectric material;
   clearing out a predetermined area of said dielectric material within said gate slots to form a primary channel, a gate slot spacer and a bottom gate;
   depositing a first gate dielectric;
   filling said slot regions with a first conductive gate material and connecting them together at their upper end surfaces with a first top gate layer;
   implanting source and drain regions at opposite end portions of said spaced, channel elements, and having a predetermined separating distance along said elements from said primary channel to form one or two secondary channels;
   deposing a planarized interlevel dielectric layer having a top surface;
   clearing out one or two predetermined regions adjacent to said first top gate, including a portion of said gate slot spacer;
   depositing a second gate dielectric;
   filling in said adjacent regions with a second conductive gate material to form a second gate structure; and
   planarizing said second conductive material to be coincident with said top surface of said interlevel dielectric layer.

2. A method of manufacturing a castellated-gate MOSFET tetrode device comprising the steps of:
   pre-conditioning a starting semiconductor substrate;
   applying active layer pad nitride masks to form trench isolation islands in said substrate;
   forming a plurality of channel elements by etching a plurality of spaced gate slots to a first predetermined depth into said substrate;
   filling said slots with a dielectric material;
   clearing out a predetermined area of said dielectric material within said gate slots to form a primary channel, a gate slot spacer and a bottom gate;
   depositing a first gate dielectric;
   forming a composite gate structure by filling said slot regions with a first conductive gate material and connecting them together at their upper end surfaces with a composite top gate electrode;
   implanting source and drain regions at opposite end portions of said spaced, channel elements, and having a predetermined separating distance along said elements from said primary channel to form one or two secondary channels;
   deposing a planarized interlevel dielectric layer having a top surface;
   defining a first top gate structure by removing one or two predefined portions of said composite top gate electrode;
   clearing out one or two predetermined regions adjacent to said first top gate electrode, including a portion of said gate slot spacer;
   depositing a second gate dielectric;
   filling in said adjacent regions with a second conductive gate material to form a second gate structure; and
   planarizing said second conductive material to be coincident with said top surface of said interlevel dielectric layer.

3. The method as claimed in claim 2, wherein said starting semiconductor substrate comprises a silicon-on-insulator wafer, and wherein said spaced gate slots are etched to the same depth as said shallow trench isolation islands and all the way to said buried insulator layer.

* * * * *